ANALOG TO DIGITAL CONVERTOR AD

INVENTORS
GORDON E. WHELPLEY
CARL J. BARTOSESKI
LEMUEL R. BREESE
GLENBER L. HINKLE

BY

*Brown, Jackson, Boettcher & Dienner*

Feb. 22, 1966 G. E. WHELPLEY ETAL 3,237,186
ANALOG TO DIGITAL CONVERTER
Filed Feb. 2, 1962
12 Sheets-Sheet 2
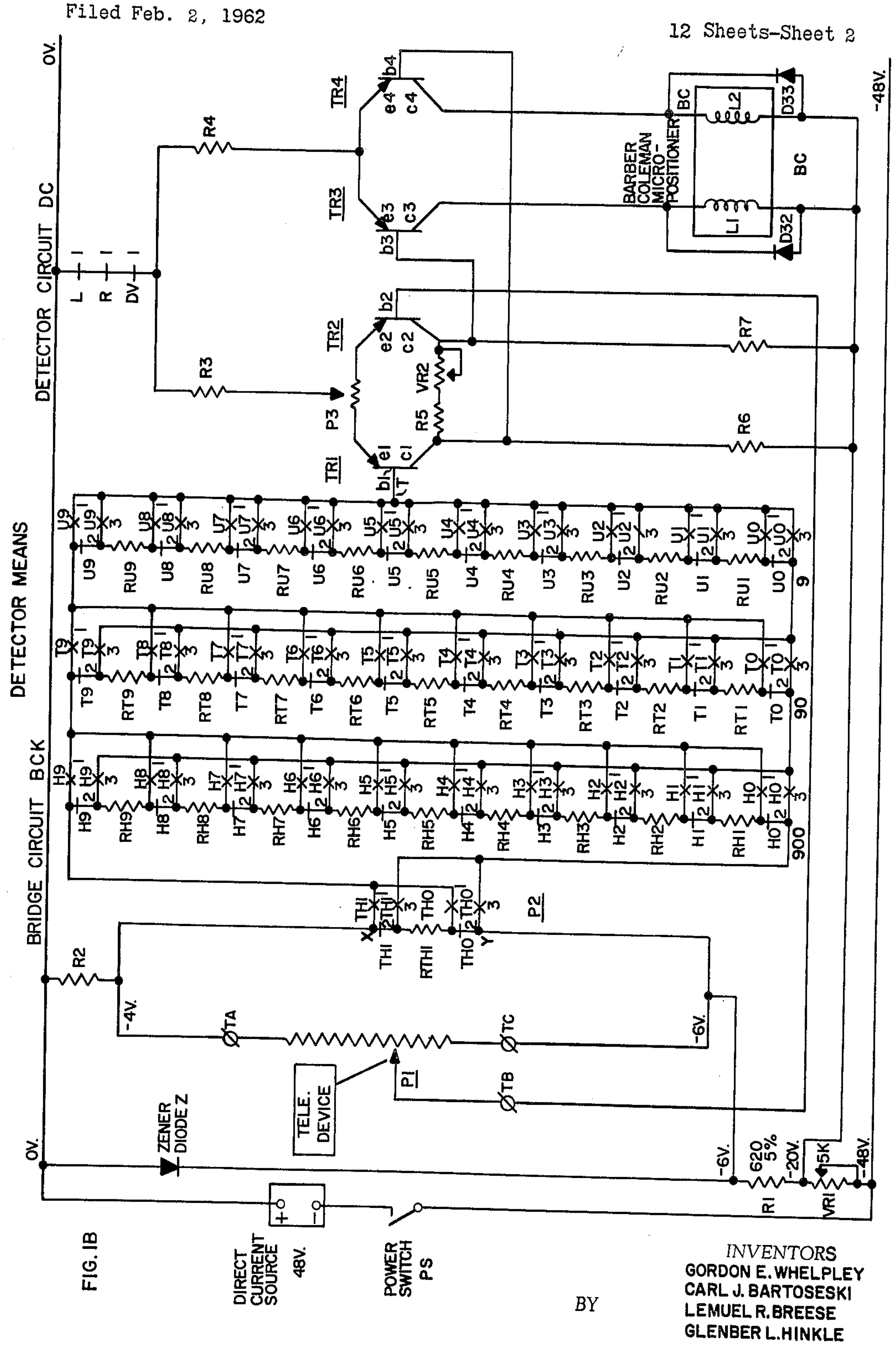
FIG. IB
INVENTORS
GORDON E. WHELPLEY
CARL J. BARTOSESKI
LEMUEL R. BREESE
GLENBER L. HINKLE
BY
Brown, Jackson, Boettcher & Dienner

ANALOG TO DIGITAL CONVERTER

Filed Feb. 2, 1962

12 Sheets-Sheet 3

INVENTORS
GORDON E. WHELPLEY
CARL J. BARTOSESKI
LEMUEL R. BREESE
GLENBER L. HINKLE

BY

Brown, Jackson, Boettcher & Dienner

ANALOG TO DIGITAL CONVERTER

Filed Feb. 2, 1962 12 Sheets-Sheet 4

INVENTORS
GORDON E. WHELPLEY
CARL J. BARTOSESKI
LEMUEL R. BREESE
GLENBER L. HINKLE

BY

Brown Jackson Boettcher & Dienner

TENS COUNTING CHAIN TCC

INVENTORS
GORDON E. WHELPLEY
CARL J. BARTOSESKI
LEMUEL R. BREESE
GLENBER L. HINKLE
BY
Brown Jackson Boettcher & Dienner Feb. 22, 1966

G. E. WHELPLEY ETAL 3,237,186

ANALOG TO DIGITAL CONVERTER

Filed Feb. 2, 1962

12 Sheets-Sheet 6

FIG. 5 HUNDREDS COUNTING CHAIN HCC

INVENTORS
GORDON E. WHELPLEY
CARL J. BARTOSESKI
LEMUEL R. BREESE
GLENBER L. HINKLE

BY

Brown Jackson Boettcher & Dienner

INVENTORS
GORDON E. WHELPLEY
CARL J. BARTOSESKI
LEMUEL R. BREESE
GLENBER L. HINKLE
BY
Brown Jackson Boettcher & Dienner Feb. 22, 1966 G. E. WHELPLEY ETAL 3,237,186

ANALOG TO DIGITAL CONVERTER

Filed Feb. 2, 1962

12 Sheets-Sheet 8

INVENTORS
GORDON E. WHELPLEY
CARL J. BARTOSESKI
LEMUEL R. BREESE
GLENBER L. HINKLE

BY

FIG. 8 DIGITAL OUTPUTS DOC

INVENTORS
GORDON E. WHELPLEY
CARL J. BARTOSESKI
LEMUEL R. BREESE
GLENBER L. HINKLE

BY

Brown, Jackson, Boettcher & Dienner

Feb. 22, 1966 G. E. WHELPLEY ETAL 3,237,186

ANALOG TO DIGITAL CONVERTER

Filed Feb. 2, 1962

12 Sheets-Sheet 10

INVENTORS
GORDON E. WHELPLEY
CARL J. BARTOSESKI
LEMUEL R. BREESE
GLENBER L. HINKLE

BY

Brown, Jackson, Boettcher & Dienner

INVENTORS
GORDON E. WHELPLEY
CARL J. BARTOSESKI
LEMUEL R. BREESE
GLENBER L. HINKLE
BY
Baum Jackson Bartilson & Dunney INVENTORS
GORDON E. WHELPLEY
CARL J. BARTOSESKI
LEMUEL R. BREESE
GLENBER L. HINKLE
BY
Brown Jackson Boettcher & Dienner United States Patent Office 3,237,186

Patented Feb. 22, 1966

3,237,186

ANALOG TO DIGITAL CONVERTER

Gordon E. Whelpley, Carl J. Bartoseski, Lemuel R. Breese, and Glenber L. Hinkle, all of Galion, Ohio, assignors to North Electric Company, Galion, Ohio, a corporation of Ohio Filed Feb. 2, 1962, Ser. No. 170,567
16 Claims. (Cl. 340—347)

Figure 1A:
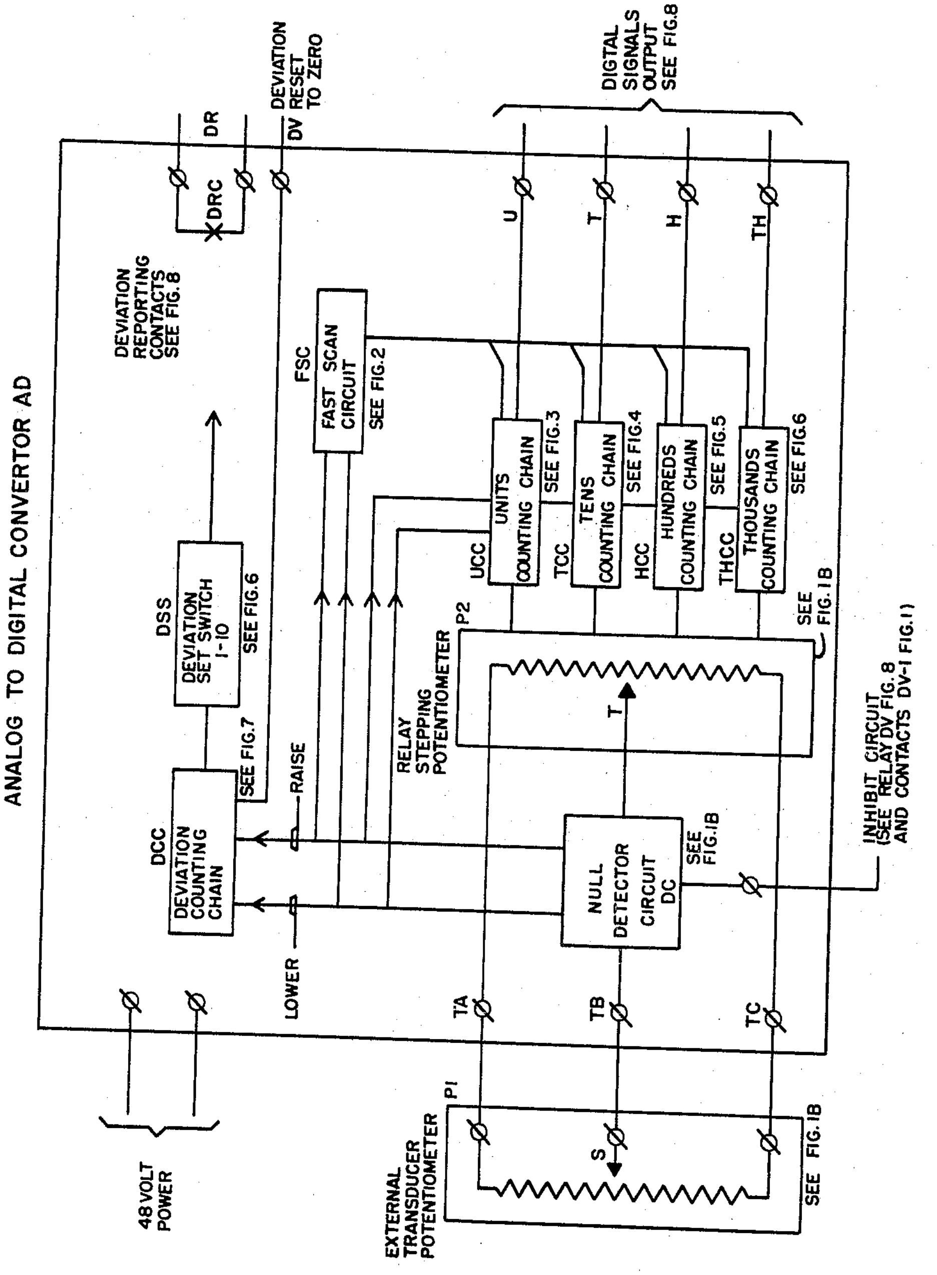

The present invention is directed to an analog to digital converter unit, and particularly to a unit for converting variable resistances, variable currents, and variable voltages to digital values.

An analog to digital converter, as now known in the field, basically comprises equipment which is automatically operative to convert electrical signals which may be representative of variable physical quantities (such as a shaft position, speed, etc.), to numerical or digital indications. By way of brief example, a rotatable shaft may have a potentiometer having a slider arm connected thereto to provide variable voltage signal outputs as the shaft moves to different angular positions. The different value signals which are provided by the potentiometer are referred to as analog signals. An "analog-to-digital" converter may then be used to convert the analog signals to signals of a digital value, such as 25 degrees, 30 degrees, etc., which is more readily understood by the attendant. The present invention is concerned with a novel converter unit which may be used for these and other similar applications.

Analog to digital converters have use in almost any field in which simulation, programming, control computation, structure analysis, and the like are important. In the aircraft field, alone, for example, analog to digital converter equipment may be used in flight simulation, automatic piloting, route programming, fire control, structure analysis, and other like applications. Other fields have similar uses for such units.

The novel converter unit of the present disclosure has been particularly successful in its operation with supervisory control equipment which is used in the supervising, metering and controlling of the apparatus in complex distribution systems. That is, in the distribution of natural gas, electrical power, water and the like from the source to the ultimate user, it is frequently necessary to provide a distribution network which may extend over an area of several thousand square miles. Since the distribution area is large and the network is complex, it is necessary to provide substations at different points in the network for the purpose of supervising and controlling the nature of the further distribution.

It was initially a practice to construct such substations in a manner as to permit manual control by attendants or operators at the substation. However, experience has shown that such installations in addition to being expensive, by reason of the twenty-four hour attendance required, are also subject to a certain number of malfunctions by reason of human error. Additionally, since such equipment requires constant maintenance including facilities for the attendants, the substation buildings and facilities are necessarily somewhat expensive from the standpoint of original cost and maintenance cost.

As a result of such factors, supervisory control equipment has been developed which permits a single attendant at a central office or control station to transmit signals over a link (frequently no more than a two conductor link) to the equipment at each of a plurality of remote substations in the system to effectively control the distribution of gas, water, or power from the source to the ultimate user. One particularly successful form of supervisory control system now used in the field is operative under the control of a single attendant at a master station to provide supervision, control, sequencing, telemetering and computing operations to control the gathering of natural gas in the field, movement thereof to the production facilities, transmission of the gas over field pipelines to the compressor stations, and thereafter transmission over a network to the distribution stations and the ultimate users of the gas. Such system is set forth in the copending application which was filed by Lemuel R. Breese on July 11, 1960, assigned Serial No. 42,087, now Patent No. 3,110,013 and assigned to the assignee of this invention.

A few of the control operations required in such system include automatic actuation of the wellhead valves and chokes at the wells in the gas field to produce set allowables on schedule from each well; data logging of production; lease-rate computations; fully automatic handling, visual indication and data logging of remote system load, visual display and data logging of wellhead and intermediate pressures; automatic processing of well stream; product separating and handling; automatic remote control of field measuring and regulating stations; automatic start-stop sequencing of remotely located engines and compressor; supervision and vernier control of three-way remotely located valves; automatically controlling discharge pressure at a remote compressor station, controlling of variables including engine r.p.m., gas flow, temperature, compression ratios, the number of compressors in operation, and the regulation of the engine operation time; analog and/or digital telemetering of flow data with automatic computation and logging; remote control of major stations which effect the distribution, measurement and regulation of the supplies to the user; and communications as well as automatic channel fault location and off-normal alarm. These and many other control functions are effected by the supervisory control system of such disclosure, it being the sole function of the attendant in achieving such control to "press a button" at the control station.

In effecting these various forms of control, it is of course essential that the attendant be supplied with sufficient information at the control station to permit the intelligent control of the equipment at the various substations in the system. Examples of information which may desirably be transmitted from a remote pumping station to the control station for the purpose of enabling the attendant to supervise the remote station include the gas pressure, rate of flow, ambient temperature, moisture content of gas, accumulated amount of gas pumped, and others. As a further aid to the control of distribution from a compressor station having pumps driven by engines, it is further necessary to provide information relating to the engine operating conditions, including such items as suction pressure and discharge pressure, engine speed, oil pressure, and the like.

In most substations information such as engine r.p.m., gas flow, temperature compression ratios, flow data and the like, is readily available in analog form. However, as indicated above, the communication link between the control station and remote station is frequently no more than a pair of conduction wires. It is necessary therefore to convert the analog information to a form of information which is more readily transmitted over the communication link of a supervisory control system, and it is an object of the present invention to provide a novel analog to digital converter equally adapted for such use.

Various units which have been designed for use in converting analog information to digital indications have been rather complex and somewhat expensive. In one known embodiment, for example, variable pressure was continuously represented by a shaft position (a measured analog quantity) and the shaft position in turn controlled equipment in the translation from a cyclic binary code to a two-out-of-five code which was stored in a memory device. Other units which were less expensive were not capable of continuously following the changes in the information (referred to as "on-line follow") or required resetting after each readout prior to a further analog to digital conversion.

It is a further object of the present invention, therefore, to provide an analog to digital converter which, in addition to being less expensive and less complex, is operative continuously to provide conversion of such information in an "on-line follow" which follows the changing values in either direction (increasing or decreasing), and which provides a continuous report thereof.

It is yet another object of the invention to provide an analog to digital converter which in addition to continuously following the changes in the information to be provided, automatically reports such information only after a predetermined deviation occurs from the previous set of information reported, the deviation which occurs prior to reporting being adjustable.

It is an additional object of the invention to provide an analog to digital converter which includes means for providing automatic reporting of the converted output only responsive to the occurrence of a preset rate of deviation, and means in the converter for preadjusting said rate to different values.

As noted above, the novel analog to digital converter converts analog information into a digital output which can be used for control, display and remote indication purposes. In providing such conversion, the novel unit includes a null detector including a first circuit which receives the analog signal and a second circuit for providing a balancing signal. In the absence of balance, an output signal is provided to control a plurality of decimal counting chains to adjust the signal output of the balancing device until a null or balance condition is reached.

In normal operation, the chain equipment moves one step at a time in the smallest increments available, and in normal "on-line follow" the converter operating at approximately twelve steps per second, is capable of converting the analog information into digital information at the rate received. However, when the converter is originally energized, the input analog information as converter to digits may be of a very high value (such as for example the digits 1803). Incremental stepping of the chains (one step at a time) over 1803 steps would obviously take an excessive amount of time.

It is a further object of the invention to provide a converter including "fast scan" means which immediately advance the chains to the value corresponding to the analog input, and thereafter adjusting the chain to operate in one step increments in following the changing analog input. In providing operation of the converter in such manner, the chain representing the digits of a higher order are operated first, and the chains representing the lower order digits are energized thereafter in sequence to achieve the initial setting in an extremely rapid operation.

It is a further object of the invention to provide a converter circuit having counting circuits for operating a balancing device in incremental steps to balance the analog input signal, and a deviation circuit which counts the number of incremental deviations after each readout of the digital information provided by the counting circuits, and means for providing a new readout only after a preset number of incremental changes occurs.

It is an additional object of the invention to provide a novel analog to digital converter which includes deviation detector means and means for inhibiting the detection of deviations during a readout and means for resetting the deviation circuit for re-use. Whenever a readout is provided subsequent to readout, the deviation detector quickly adjusts the converter to the new reading represented by the analog input.

It is yet another object of the invention to provide a plurality of separate and distinct digital readout circuits, including a visual in-line display readout circuit, and marking conductor readout circuit.

It is another object of the invention to provide a novel analog to digital converter which is sufficiently flexible in operation to convert analog signals represented by a proportional resistance, voltage, or current into a decimal signal output.

Figure 9:
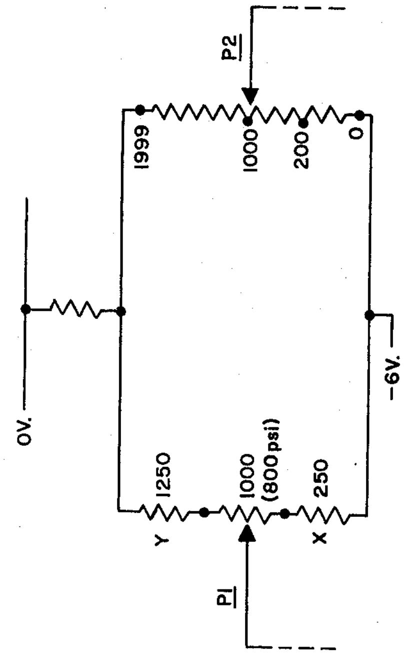
Figure 10:
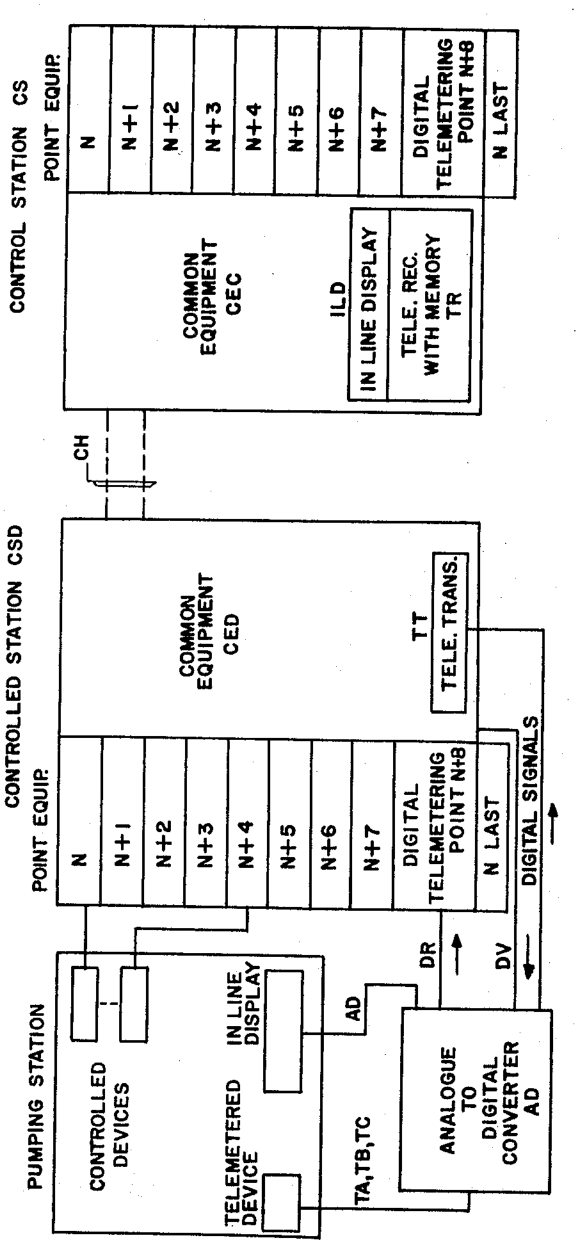
Figure 11:
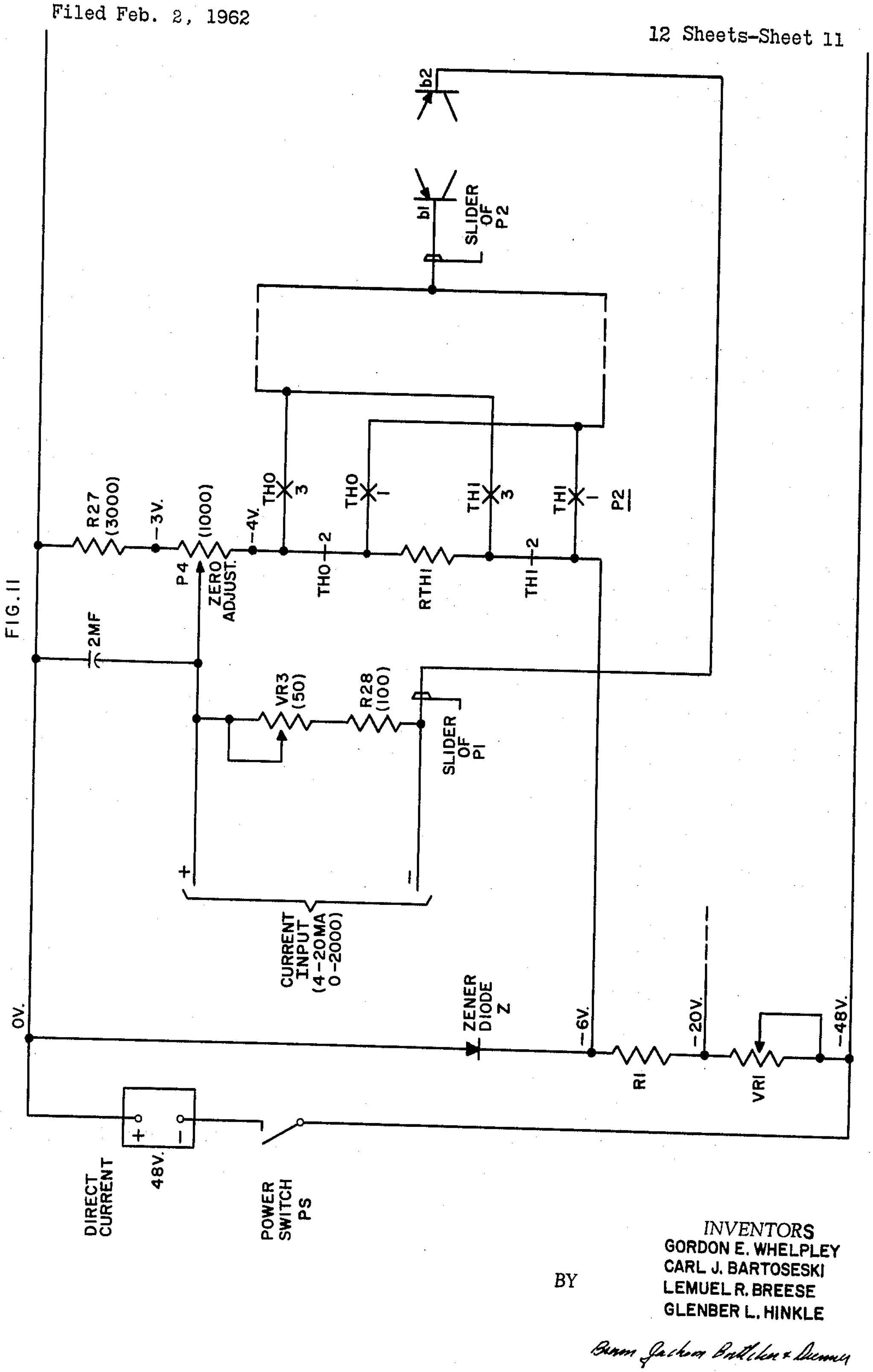
Figure 12:
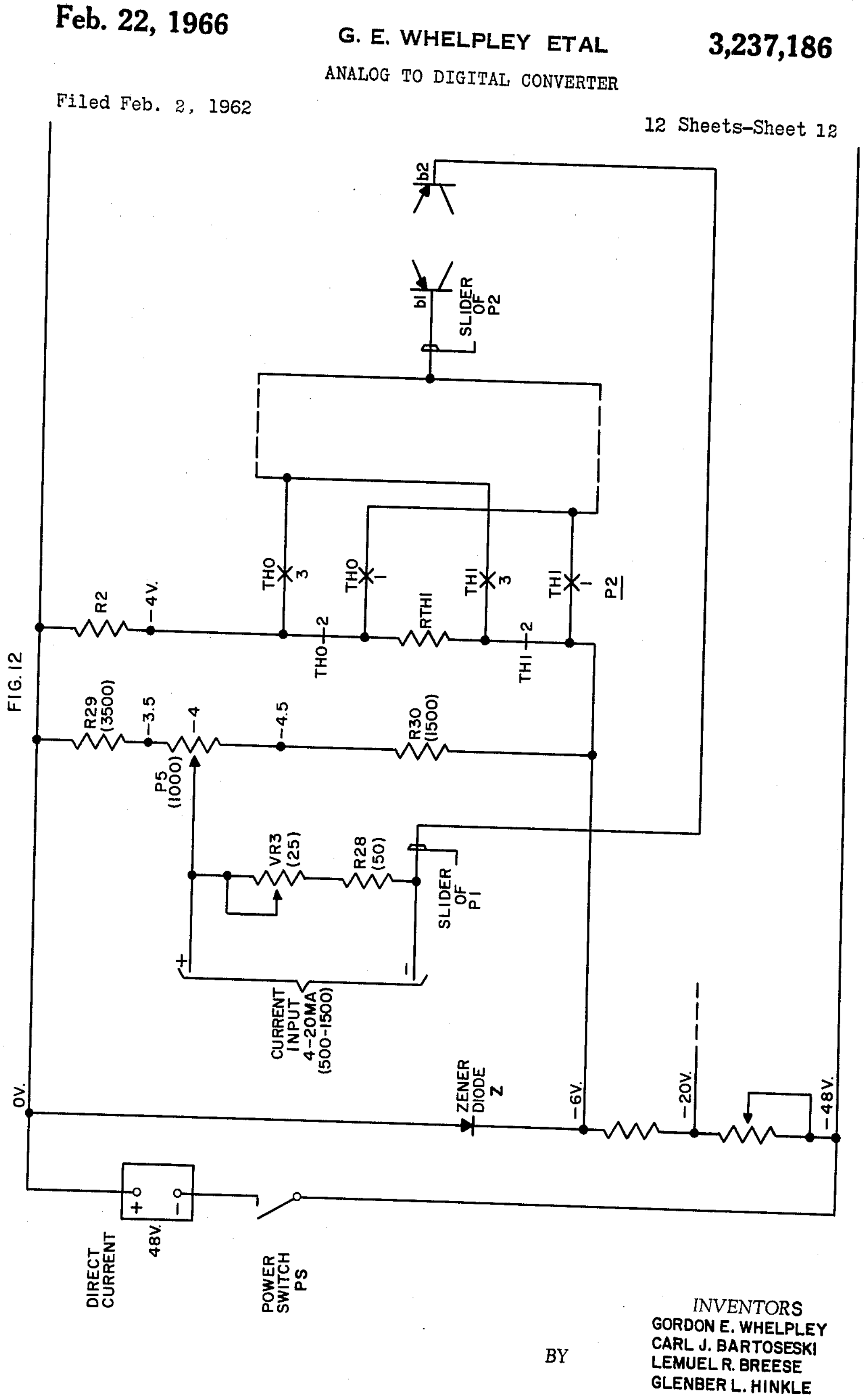

These and other objects, features and advantages of the present invention will become apparent with consideration of the following detailed description of a specific embodiment thereof when taken in conjunction with the accompanying drawings wherein:

FIGURE 1A is a block diagram of the novel analog to digital converter;

FIGURES 1B, 2–8 when assembled side by side, set forth a circuit diagram of the novel converter represented by the blocks in FIGURE 1;

FIGURE 9 sets forth, schematically, a circuit modification for providing different signal input ranges;

FIGURE 10 is a block diagram of one form of supervisory control system in which the novel analog to digital converter may be used; and FIGURES 11 and 12 are circuit diagrams of different analog input arrangements which may be used with the novel converter.

GENERAL DESCRIPTION OF SYSTEM APPLICATION OF CONVERTER

With reference to FIGURE 10, the manner of use of the novel analog-to-digital converter in a supervisory control system is shown thereat. As there illustrated, the system includes a control station CS and at least one remote or controlled station CSD interconnected by a channel CH, which may be a pair of conductors, over which impulses are transmitted for the purpose of conveying information between the two stations CS, CSD. The illustrated stations may be a part of a supervisory system for a gas distribution network, the remote station including compressor equipment for providing the necessary pressure for distribution. Each of the stations includes common equipment CEC, CED, the common equipment CEC at the control station including an in-line display ILD (such as lamp indicators for each of the points), a telemetering memory receiver circuit TR, and the common equipment CED at the controlled station including a telemetering transmitter TT. The nature of the common control equipment including the point equipment is shown in the above identified copending application.

Each of the stations also includes a plurality of points N—N last, one of which (N+8) is assigned to digital telemetering equipment. As shown in FIGURE 10, points N—N+4 are used to control the selective operation of the controlled devices at the pumping station. The point N+8 is used for providing information relating to a telemetered device at the pumping station to telemetering equipment for transmission over the link to the control station, the analog output of the telemetered device is connected over terminals TA, TB and TC to the analog to digital converter.

The converter includes a first output conductor "digital signals" which extends to the telemetering transmitter, and a second output circuit which is connected over conductor ID to the in-line display at the pumping station. If automatic reporting is provided, the analog to digital converter is also connected over "deviation" report conductor to the telemetering point N+8, and the common equipment is connected over ready back conductor DV to the analog to digital converter.

In operation, the supervisory system provides automatic reporting of deviations which occur in the information received from the telemetering device, or alternatively the operator may control the equipment to provide a reading between automatic reportings.

More specifically, the novel converter AD continuously translates the variable analog signals which are provided by the telemetering device at the pumping station into digital signals, and the output of the converter AD is continuously supplied over conductor ID to the in-line display at the pumping station. Additionally, with automatic reporting whenever a predetermined deviation from the previous report occurs, the converter engages the digital telemetering point by transmitting a "deviation reached" signal over the DR conductor to the associated point N+8.

As the telemetering point N+8 is engaged, the telemetering transmitter is set to the starting point associated with the seized point, and the common equipment transmits signals over the channel to the control station to effect the selection of the digital telemetering receiver at the point N+8 thereat and sets the receiver at the starting point associated with the seized point.

Thereupon, the digital signals provided by the converter AD are transmitted over the channel to the control station, and as the telemetering and transmitting receiver advance with each digital transmission, the signals are fed to the memory circuit at the control station which causes the in-line display thereat to exhibit to the attendant the digits representative of the telemetered signal. The memory circuit which comprises magnetic latched relays controls display of the digits until a further report is received.

Alternatively, if the operator wishes to ascertain the reading associated with the telemetered device between automatic reportings, the point selection key associated with the digital telemetering point N+8 is operated to establish the entry point to the telemetering receiver TR, and to control the common equipment to signal the identity of the digital telemetering point N+8 over the channel to the common equipment at the controlled station. The common equipment of the controlled station effects the selection of the associated digital telemetering point N+8 over the channel to the common equipment at the controlled station. The common equipment of the controlled station effects the selection of the associated digital telemetering point N+8 thereat which determines the entry point to the telemetering transmitter TT, and also signals the analog to digital converter to inhibit any change of reading while reporting takes place.

Thereupon the telemetering transmitter TT causes the common equipment to transmit the digits provided by the analog to digital converter to the control station, and the telemetering receiver TR at the control station causes the information to be recorded in the proper place in the memory circuit which adjusts the in-line display accordingly. The memory circuit holds the setting on the in-line display until further change is reported.

Other methods of use of the novel converter in such system and other will be more apparent from the following description of the converter structure.

GENERAL DESCRIPTION OF ANALOG TO DIGITAL CONVERTER

With reference now to FIGURE 1A, there is shown thereat in block form the component elements of the analog to digital converter, including the input and output conductors for connecting the converter in a supervisory system, such as set forth in FIGURE 10.

As there shown, the analog to digital converter comprises a set of input terminals TA, TB, TC for connecting the converter to the output of an external transducer potentiometer P1 which is associated with the telemetered devices. In one specific embodiment, for example, the potentiometer P1 comprises a re-transmitting slide wire or a pressure to resistance converter, such as is commercially available as an IRC Compu-tran, Calvin Laboratories, Series 8416, Ediliff model 2–38, etc. Such potentiometer, in one embodiment, had a resistance of 1000 ohms, and the outer ends of the transducer potentiometer P1 are connected over terminals TA, TC to the outer ends of a relay stepping potentiometer P2. The sliding arms of the potentiometer P1 and P2 are connected to a null detector circuit DC.

Then null detector circuit DC comprises a sensitive relay driven by a transistor amplifier which is operative to detect a difference between the signals provided by the external potentiometer P1 and the relay stepping potentiometer P2.

With the detection of the difference, the detector circuit DC controls a drive circuit in the operation of counting chains including a units chain UCC, a tens chain TCC, a hundreds chain HCC and a thousands chain THCC, to insert resistances in the increments necessary to effect balance of the bridge, or zero difference between the signals provided by potentiometers P1 and P2. Once the chains have been adjusted to represent the value of the analog input signal, the converter is connected "on-line" and deviations from such value are quickly detected and followed, the units counting chain UCC moving one step at a time to provide changes in the smallest increments available.

However, in providing the initial reading, it is apparent that stepping of the chains in such small increments to provide an initial reading of a large number (such as 1903, for example) would require a substantial amount of time, and accordingly the novel converter includes a fast scan circuit FSC which automatically first controls the hundreds chain HCC to operate and thereafter the tens and units chains for the purpose of arriving at the initial balance in a rapid manner. The novel manner of accomplishing an initial fast balance in such manner is described more fully hereinafter. Once the initial balance is reached, the counting means are operative one step at a time to follow the incremental change in the input signal.

The detector circuit in its operation of the chain also controls a deviation counting chain DCC which counts the number of incremental steps of the counting means which are made from the last readout. A deviation set switch DSS is preadjustable to each of ten different positions, and is operative to each position to provide a different number of steps preliminary to readout. Thus, whenever the detector circuit DC advances the deviation counting chain DCC to the number represented by the position of the deviation set switch DSS, a set of contacts DRC close the circuit over conductor DR to an associated telemetering point (N+8—FIGURE 10) for the purpose of indicating to the point that the converter is prepared to provide a readout.

When the equipment in the associated station is ready to receive a readout, a signal is transmitted back over the DV lead and an inhibit circuit to the null detector circuit DC for the purpose of freezing or inhibiting a reading by the device until such time as the readout is completed. A signal back over the DV lead also controls reset of the deviation counting chain to the zero position so that it can start a new deviation count as soon as the null detector circuit DC is released.

The output of the analog to digital converter is extended over the digital signal output leads to the telemetering transmitter TT for transmission to the control station, the ouput signals being in the form of decimal coded information transmitted over thousands conductors TH, hundreds conductors H, tens conductors T, and units conductors U. Digital signals are also transmitted over a second output circuit to a lamp display for the purpose of effecting the display of the information on associated in-line display located in the compressor station, whereby both the attendant at the control station and personnel visiting the compressor station are both fully informed. Also, although not illustrated herein, the output of the analog to digital converter may be used for control purposes.

SPECIFIC DESCRIPTION OF ANALOG TO DIGITAL CONVERTER

*I. Identification of components*

Prior to the detailed description of the operating parts, reference is made to the following tables for the purpose of indicating the location of the various circuits in FIGURES 1B, 2–8.

TABLE I

Figure 2:
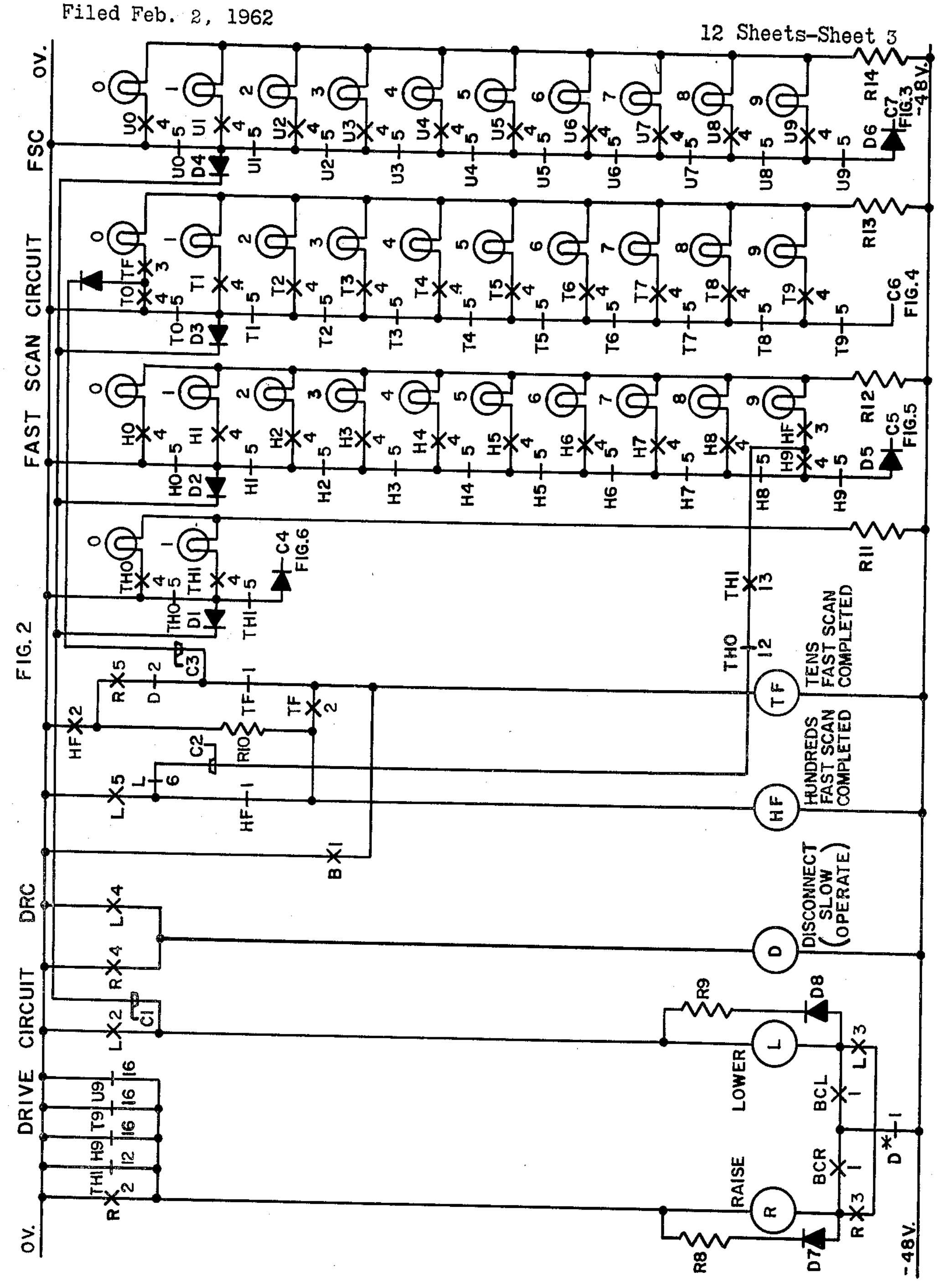
Figure 3:
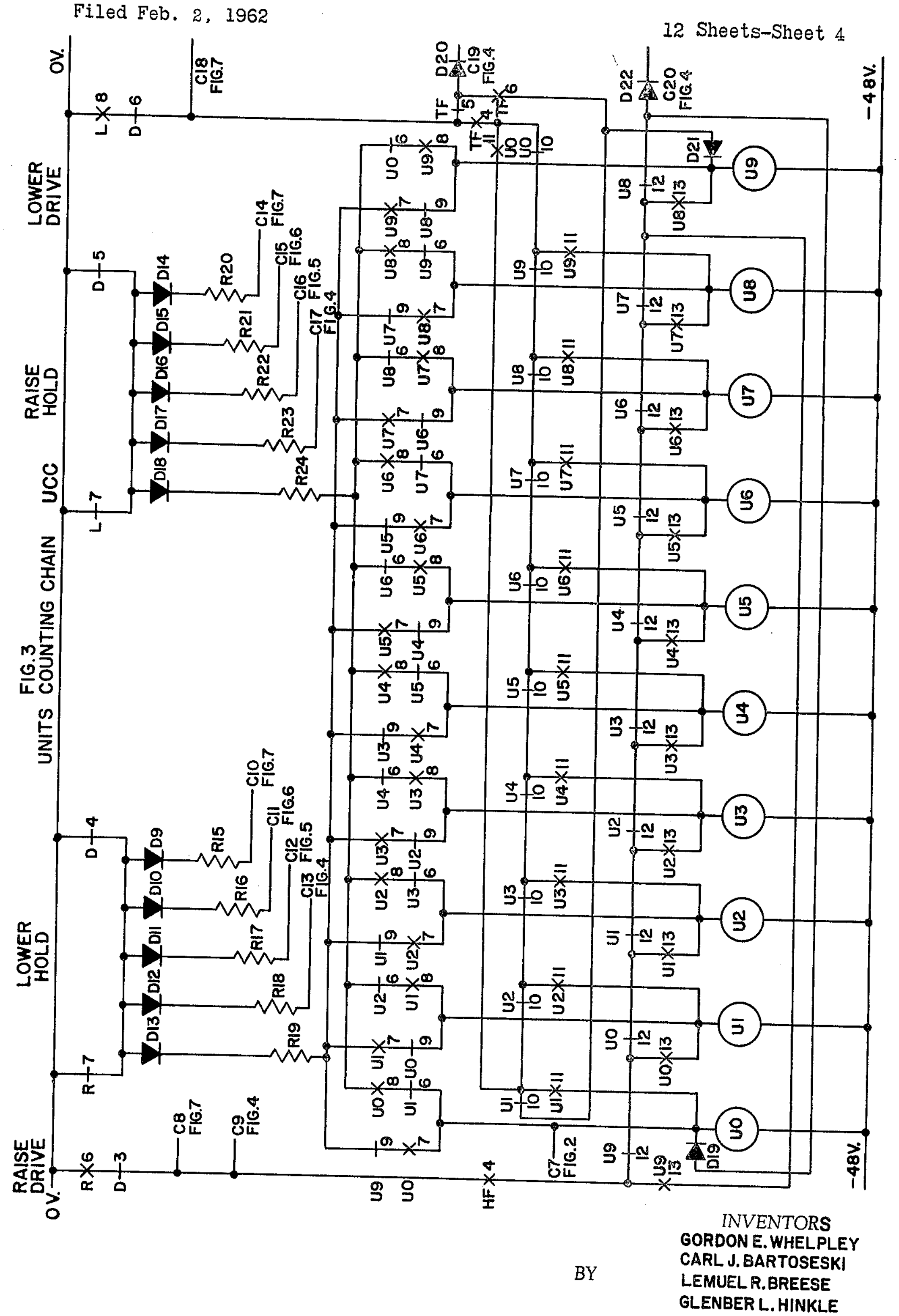
Figure 4:
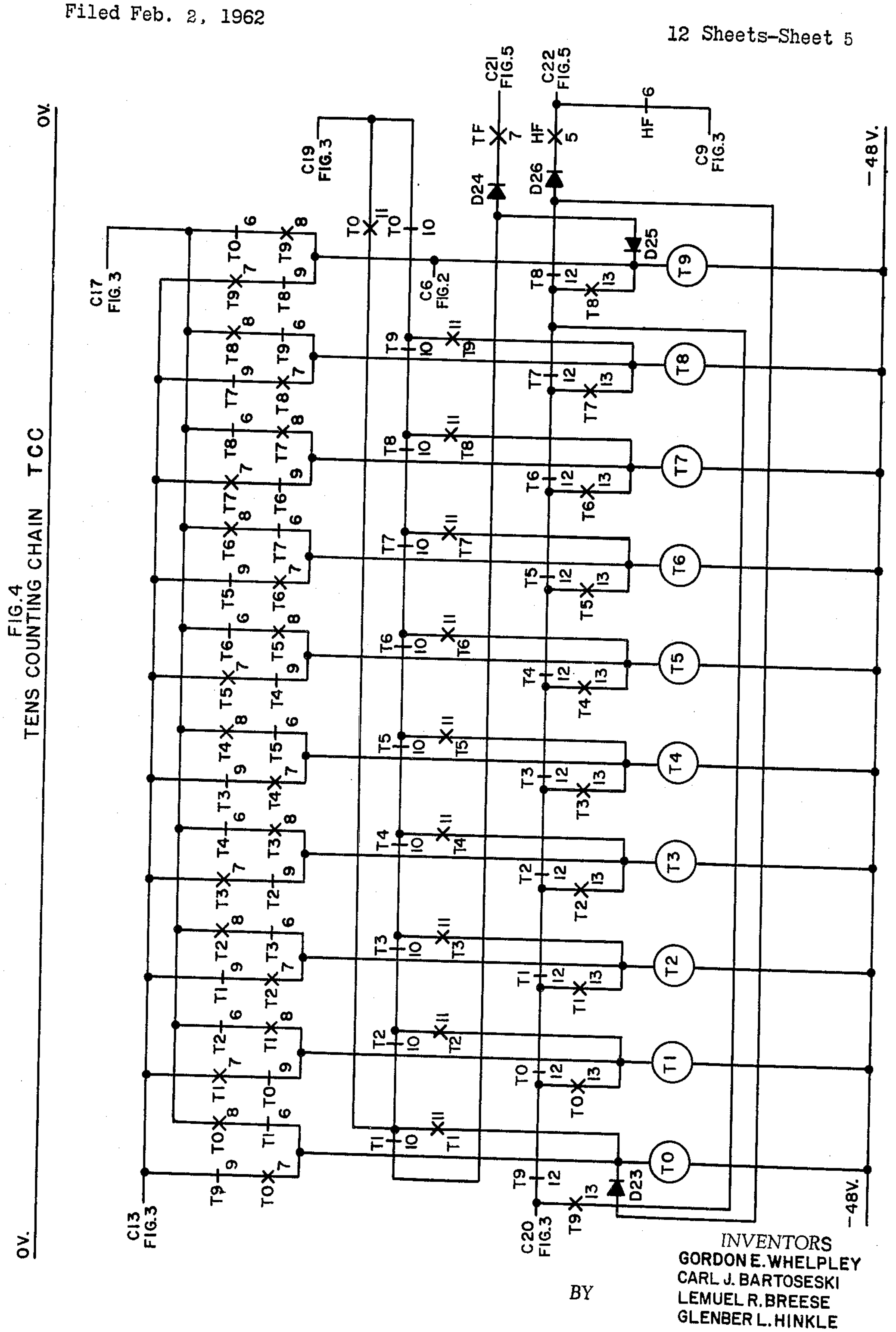
Figure 5:
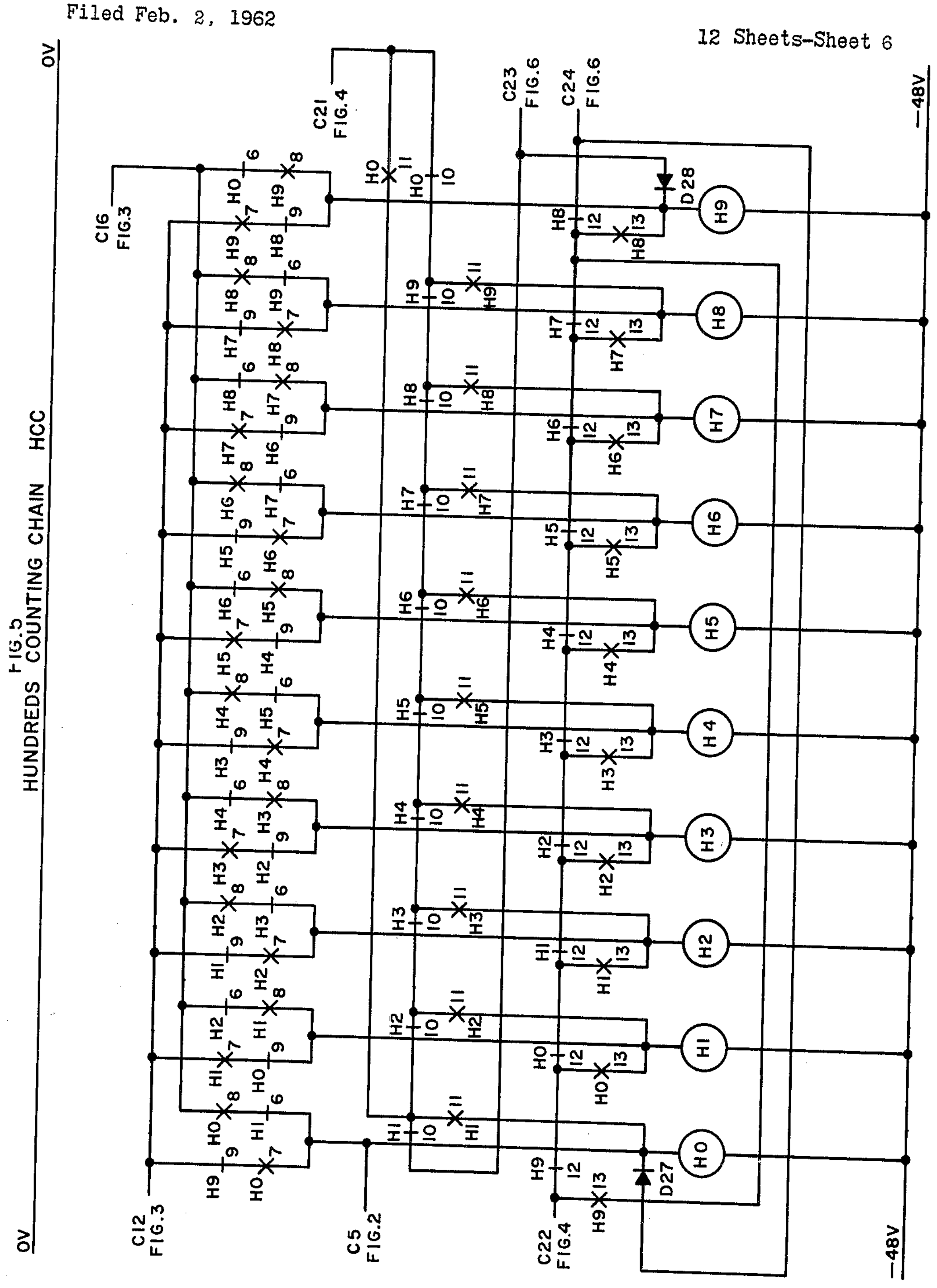
Figure 6:
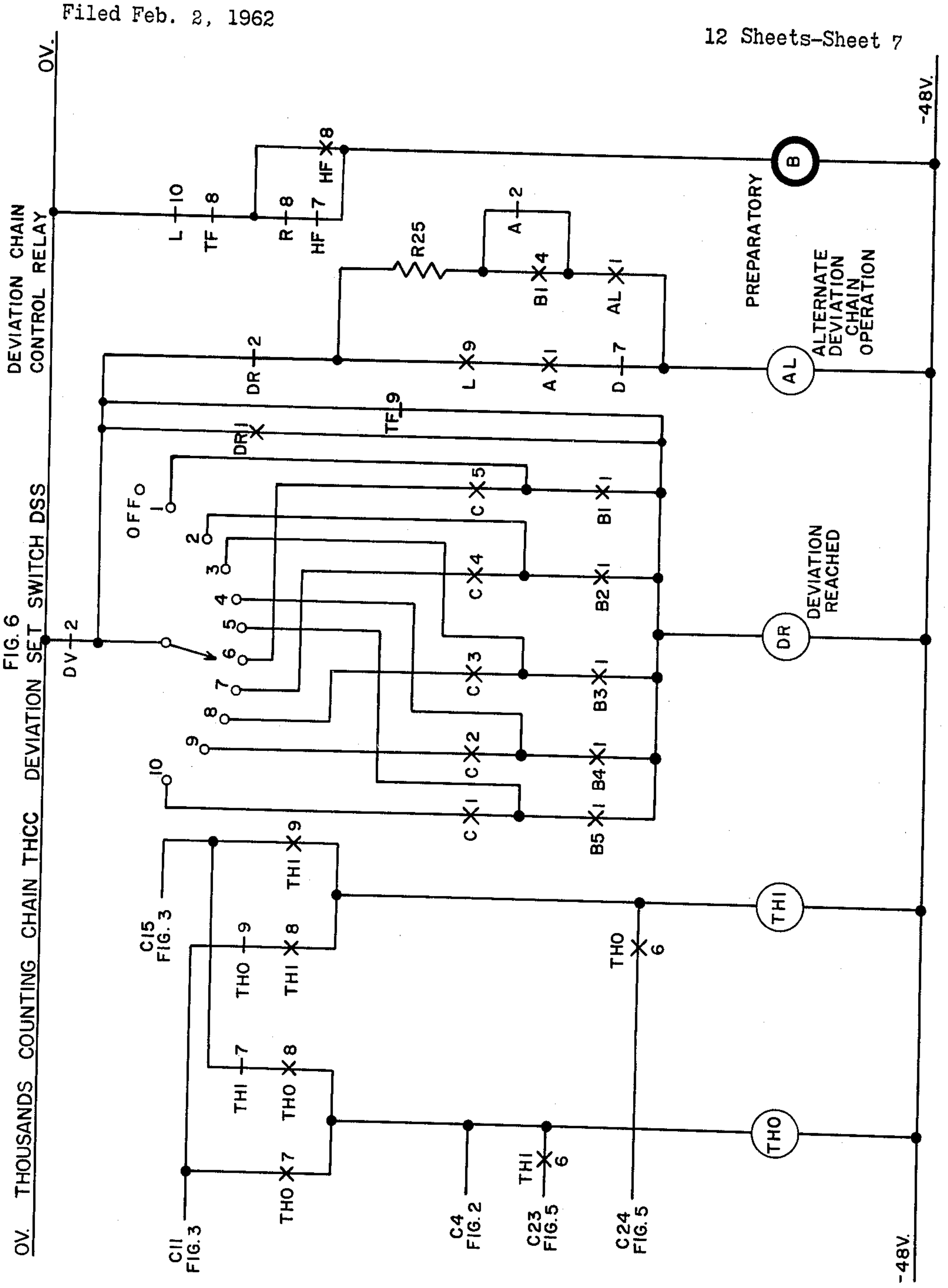
Figure 7:
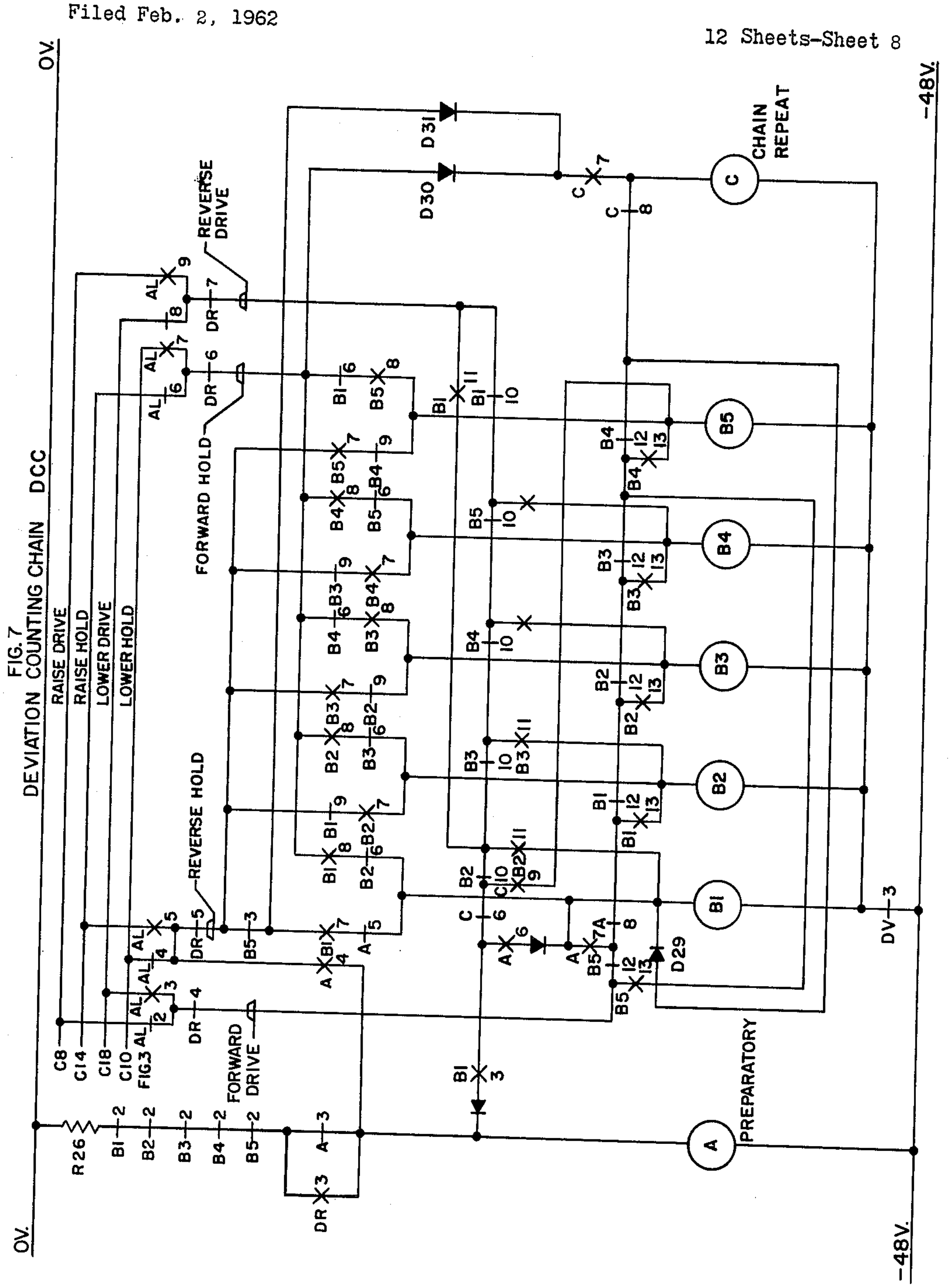
Figure 8:
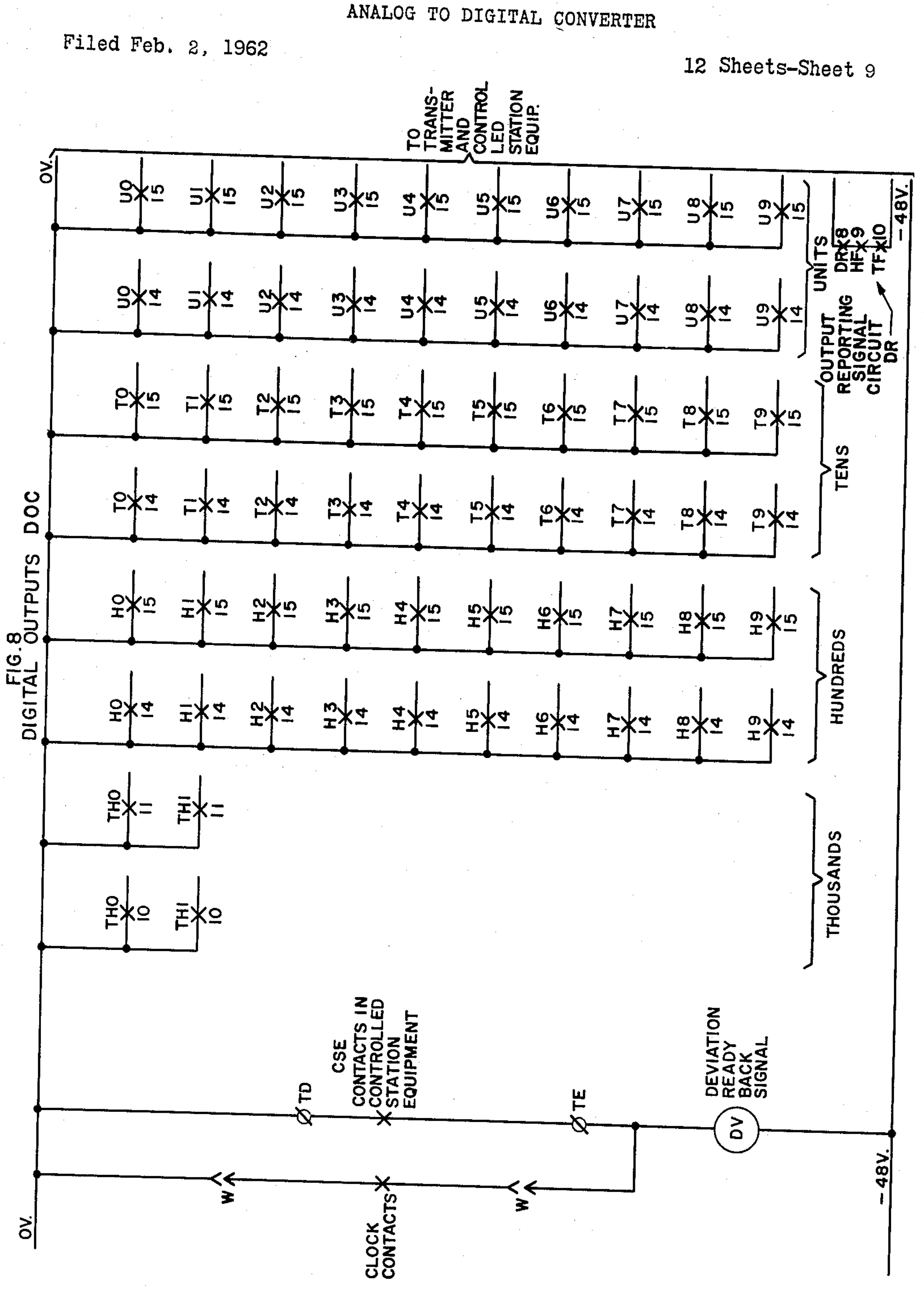

| | |
|---|---|
| Bridge Circuit (BCK) | FIGURE 1B left. |
| Detector Circuit (DC) | FIGURE 1B right. |
| Drive Circuit (DRC) | FIGURE 2 left. |
| Fast Scan Circuit (FSC) | FIGURE 2 right. |
| Units Counting Chain (UCC) | FIGURE 3. |
| Ten Counting Chain (TCC) | FIGURE 4. |
| Hundreds Counting Chain (HCC) | FIGURE 5. |
| Thousands Counting Chain (THCC) | FIGURE 6 left. |
| Deviation Control Circuit | FIGURE 6 center. |
| Deviation Counting Chain (DCC) | FIGURE 7. |
| Digital Output Circuit (DOC) | FIGURE 8. |

The bridge circuit (BCK) and detector circuit (DC) together comprise detector means.

As a further aid to the location of the relays which are connected in the various circuits, the following table sets forth the relays in alphabetical order and identifies the figures on which the relays and their contacts are located. Although no special symbolism has been used to indicate make-before-break operation, it is to be understood that such pattern is effected where necessary.

TABLE II

| | Fig. 1 | Fig. 2 | Fig. 3 | Fig. 4 | Fig. 5 | Fig. 6 | Fig. 7 | Fig. 8 |
|---|---|---|---|---|---|---|---|---|
| A (Fig. 7) | | | | | | 1, 2 | 3, 4, 5, 6, 7, 8 | |
| B (Fig. 6) | | 1 | | | | | | |
| AL (Fig. 6) | | | | | | 1 | 2, 3, 4, 5, 6, 7, 8, 9 | |
| B1 (Fig. 7) | | | | | | 1, 4 | 2, 3, 6, 7, 8, 9, 10, 11, 12, 13. | |
| B2 (Fig. 7) | | | | | | 1 | 2, 6, 7, 8, 9, 10, 11, 12, 13. | |
| B3 (Fig. 7) | | | | | | 1 | 2, 6, 7, 8, 9, 10, 11, 12, 13. | |
| B4 (Fig. 7) | | | | | | 1 | 2, 6, 7, 8, 9, 10, 11, 12, 13. | |
| B5 (Fig. 7) | | | | | | 1 | 2, 3, 6, 7, 8, 9, 10, 11, 12, 13. | |
| C (Fig. 7) | | | | | | 1, 2, 3, 4, 5, 7 | 6, 7, 8 | |
| D (Fig. 2) | 2 | 2 | 3, 4, 5, 6 | | | 1, 2 | 3, 4, 5, 6, 7 | 8 |
| DR (Fig. 6) | | | | | | 2 | 3 | |
| DV (Fig. 8) | 1 | | | | | 7, 8 | | 9 |
| HF (Fig. 2) | | 1, 2, 3 | 4 | 5, 6 | | | | |
| HO (Fig. 5) | 1, 2, 3 | 4, 5 | | | 6, 7, 8, 9, 10, 11, 12, 13 | | | 14, 15 |
| H1 (Fig. 5) | 1, 2, 3 | 4, 5 | | | 6, 7, 8, 9, 10, 11, 12, 13 | | | 14, 15 |
| H2 (Fig. 5) | 1, 2, 3 | 4, 5 | | | 6, 7, 8, 9, 10, 11, 12, 13 | | | 14, 15 |
| H3 (Fig. 5) | 1, 2, 3 | 4, 5 | | | 6, 7, 8, 9, 10, 11, 12, 13 | | | 14, 15 |
| H4 (Fig. 5) | 1, 2, 3 | 4, 5 | | | 6, 7, 8, 9, 10, 11, 12, 13 | | | 14, 15 |
| H5 (Fig. 5) | 1, 2, 3 | 4, 5 | | | 6, 7, 8, 9, 10, 11, 12, 13 | | | 14, 15 |
| H6 (Fig. 5) | 1, 2, 3 | 4, 5 | | | 6, 7, 8, 9, 10, 11, 12, 13 | | | 14, 15 |
| H7 (Fig. 5) | 1, 2, 3 | 4, 5 | | | 6, 7, 8, 9, 10, 11, 12, 13 | | | 14, 15 |
| H8 (Fig. 5) | 1, 2, 3 | 4, 5 | | | 6, 7, 8, 9, 10, 11, 12, 13 | | | 14, 15 |
| H9 (Fig. 5) | 1, 2, 3 | 4, 5 | | | 6, 7, 8, 9, 10, 11, 12, 13 | | | 14, 15 |
| L (Fig. 2) | 1 | 2, 3, 4, 5, 6 | 7, 8 | | | 9, 10 | | |
| R (Fig. 2) | 1 | 2, 3, 4, 5 | 6, 7 | | | 8 | | |
| TF (Fig. 2) | 2 | 2, 3 | 4, 5, 6 | 7 | | 8, 9 | | 10 |
| TO (Fig. 4) | 1, 2, 3 | 4, 5 | | 6, 7, 8, 9, 10, 11, 12, 13 | | | | 14, 15 |
| T1 (Fig. 4) | 1, 2, 3 | 4, 5 | | 6, 7, 8, 9, 10, 11, 12, 13 | | | | 14, 15 |
| T2 (Fig. 4) | 1, 2, 3 | 4, 5 | | 6, 7, 8, 9, 10, 11, 12, 13 | | | | 14, 15 |
| T3 (Fig. 4) | 1, 2, 3 | 4, 5 | | 6, 7, 8, 9, 10, 11, 12. 13 | | | | 14, 15 |
| T4 (Fig. 4) | 1, 2, 3 | 4, 5 | | 6, 7, 8, 9, 10, 11, 12, 13 | | | | 14, 15 |
| T5 (Fig. 4) | 1, 2, 3 | 4, 5 | | 6, 7, 8, 9, 10, 11, 12, 13 | | | | 14, 15 |
| T6 (Fig. 4) | 1, 2, 3 | 4, 5 | | 6, 7, 8, 9, 10, 11, 12, 13 | | | | 14, 15 |
| T7 (Fig. 4) | 1, 2, 3 | 4, 5 | | 6, 7, 8, 9, 10, 11, 12, 13 | | | | 14, 15 |
| T8 (Fig. 4) | 1, 2, 3 | 4, 5 | | 6, 7, 8, 9, 10, 11, 12, 13 | | | | 14, 15 |
| T9 (Fig. 4) | 1, 2, 3 | 4, 5, 16 | | 6, 7, 8, 9, 10, 11, 12, 13 | | | | 14, 15 |
| THO (Fig. 6) | 1, 2, 3 | 4, 5 | | | | 6, 7, 8, 9 | | 10, 11 |
| TH1 (Fig. 6) | 1, 2, 3 | 4, 5, 12 | | | | 6, 7, 8, 9 | | 10, 11 |
| UO (Fig. 3) | 1, 2, 3 | 4, 5 | 6, 7, 8, 9, 10, 11, 12, 13 | | | | | 14, 15 |
| U1 (Fig. 3) | 1, 2, 3 | 4, 5 | 6, 7, 8, 9, 10, 11, 12, 13 | | | | | 14, 15 |
| U2 (Fig. 3) | 1, 2, 3 | 4, 5 | 6, 7, 8, 9, 10, 11, 12, 13 | | | | | 14, 15 |
| U3 (Fig. 3) | 1, 2, 3 | 4, 5 | 6, 7, 8, 9, 10, 11, 12, 13 | | | | | 14, 15 |
| U4 (Fig. 3) | 1, 2, 3 | 4, 5 | 6, 7, 8, 9, 10, 11, 12, 13 | | | | | 14, 15 |

TABLE II—*Continued*

| | Fig. 1 | Fig. 2 | Fig. 3 | Fig. 4 | Fig. 5 | Fig. 6 | Fig. 7 | Fig. 8 |
|---|---|---|---|---|---|---|---|---|
| U5 (Fig. 3) | 1, 2, 3 | 4, 5 | 6. 7, 8, 9, 10, 11, 12, 13 | ----- | ----- | ----- | ----- | 14, 15<br>14, 15 |
| U6 (Fig. 3) | 1, 2, 3 | 4, 5 | 6, 7, 8, 9, 10, 11, 12, 13 | ----- | ----- | ----- | ----- | 14, 15 |
| U7 (Fig. 3) | 1, 2, 3 | 4, 5 | 6, 7, 8, 9, 10, 11, 12, 13 | ----- | ----- | ----- | ----- | 14, 15 |
| U8 (Fig. 3) | 1, 2, 3 | 4, 5 | 6, 7, 8, 9, 10, 11, 12, 13 | ----- | ----- | ----- | ----- | 14, 15 |
| U9 (Fig. 3) | 1, 2, 3 | 4, 5 | 6, 7, 8, 9, 10, 11, 12, 13 | ----- | ----- | ----- | ----- | 14, 15 |
| Barber-Coleman Micropositioner (Fig. 1) | ----- | BCR<br>BCL | ----- | ----- | ----- | ----- | ----- | ----- |

In order to (1) indicate connections of conductors between pages, (2) avoid crossing many lines, and (3) avoid running through intervening figures, back and forth references between conductors are employed. Table III following lists such conductors, the figure in which the conductor originates and the figure to which it extends.

TABLE III

C4 (FIG. 2) to C4 (FIG. 6)
C5 (FIG. 2) to C5 (FIG. 5)
C6 (FIG. 2) to C6 (FIG. 4)
C7 (FIG. 3) to C7 (FIG. 3)
C8 (FIG. 3) to C8 (FIG. 7)
C9 (FIG. 3) to C9 (FIG. 4)
C10 (FIG. 3) to C10 (FIG. 7)
C11 (FIG. 3) to C11 (FIG. 6)
C12 (FIG. 3) to C12 (FIG. 5)
C13 (FIG. 3) to C13 (FIG. 4)
C14 (FIG. 3) to C14 (FIG. 7)
C15 (FIG. 3) to C15 (FIG. 6)
C16 (FIG. 3) to C16 (FIG. 5)
C17 (FIG. 3) to C17 (FIG. 4)
C18 (FIG. 3) to C18 (FIG. 7)
C19 (FIG. 3) to C19 (FIG. 4)
C20 (FIG. 3) to C20 (FIG. 4)
C21 (FIG. 4) to C21 (FIG. 5)
C22 (FIG. 4) to C22 (FIG. 5)
C23 (FIG. 5) to C23 (FIG. 6)
C24 (FIG. 5) to C24 (FIG. 6)

On the drawings standard detached contacts symbolism is used as follows:

(1) X represents a normally open contact
(2) — represents a normally closed contact
(3) The designation above or to the left of the contact symbol is the relay designation
(4) The designation below or to the right of the contact symbol is the contact designation In the illustrated embodiment the values of the resistors in the right side of the bridge might be as follows:

| | | Ohms |
|---|---|---|
| RTH1 | | 1000 |
| RH1 to RH9 | each | 100 |
| RT1 to RT9 | each | 10 |
| RU1 to RU9 | each | 1 |

*II. Power supply*

With reference now to the specific circuit of FIGURES 1B and 2–8 (and particularly FIGURE 1) it will be apparent that the converter is energized by 48 volts direct current source which is adapted to be connected to the zero volt —48 volt conductors by an on-off power switch PS. With the switch closed, power is coupled to the zero and —48 volt conductors. The Zener diode Z is connected to provide a 6-volt potential to the —6 volt detector, and variable resistor VR1 and resistor R1 are connected between the —6 volt conductor and —48 volt conductor, the variable resistor VR1 being adjustable to provide —20 volt to the conductor which is connected between resistors R1 and VR1. Upon closure of the power switch, relay DR (FIG. 6) operates over contacts DV–2, TF–9 and the winding of DR; and locks over contacts DR–1 and DV–2. Also upon closure of the power switch contacts, relay A (FIG. 7) operates and locks, and slow operate relay B (FIG. 6) is energized. However, in most operations contacts in its circuit open before relay B operates.

*III. Bridge circuit (BC)*

The bridge circuit BC is basically comprised of a first or left circuit including the external transducer potentiometer P1 associated with the telemetered device, and a plurality of resistors RH1–RH9, RT1–RT9, RU1–RU9, arranged to be connected in a second or right circuit of the bridge, identified generally as potentiometer P2.

The potentiometer P1 is an end to end resistance of 2000 ohms, for example, and may comprise an IRC computation unit as noted above. The slider of potentiometer P1 in its movement provides an upper left leg and a lower left leg of equal resistance value. Movement of the slider transfers resistance from one leg to the other leg.

The stepping potentiometer P2 includes resistors RU1–RU9 which are each one ohm in value, resistors RT1–RT9 which are each 10 ohms, resistors RH1–RH9 which are each 100 ohms, and resistance RTH1 which is 1000 ohms, whereby the total resistance which may be connected in the bridge circuit as potentiometer P2 is 1999 ohms. The resistances in the stepping potentiometer are arranged to be connected on one of two effective legs (upper and lower) which extend between points X and Y on the left and conductor T on the right which corresponds to the slider on potentiometer P1. Thus, if one half the resistance of the group RH1–RH9, RT1–RT9, RU1–RU9 are connected in the lower leg and the other half are connected in the upper leg, the stepping potentiometer P2 is effectively set with its "slider" T at the midpoint. Since two volts appears across the bridge, one volt is applied over the slider T. Manifestly, connection of less resistance in the lower leg in effect moves the slider T downward, and connection of less resistance in the upper arm in effect moves the slider T upward.

The connection of resistances RU1–RU9 in the upper or lower legs (or arms) of potentiometer P2 is controlled by contacts 1–3 on the relays U1–U9 in the units counting chain UCC (FIGURE 3), the connection of the resistances RT1–RT8 therein is controlled by contacts 1–3 on relays T1–T9 in the tens counting chain TCC, the connection of the resistances RH1–RH9 is controlled by contacts 1–3 on relays in the hundreds counting chain H1–H9, and connection of resistance RTH1 in the upper and lower arm of potentiometer P2 is controlled by contacts 1–3 on relays TH0–TH1 on the thousands counting chain THCC.

Resistor R2, connected to the upper ends of potentiometers P1, P2, is in the order of 2000 ohms and the lower ends of the potentiometers P1, P2 are connected to the —6 volt conductor. Accordingly, with potentiometers at their full resistance values of 2000 ohms each, a potential in the order of —4 volts appears across resistance R2, and a potential of 2 volts appears across each of the potentiometers P1, P2. Since stepping potentiometer has 2000 steps, and since 2 volts is placed across the 2000 ohm stepping potentiometer, each step results in a one mil volt change in the signal coupled to the detector circuit DC.

With such arrangement the limits of extreme excursions of potentiometer P1 and the stepping potentiometer P2 will be −4 volts and −6 volts.

The voltage excursions provided by the potentiometers are connected to the detector circuit DC, and specifically to the transistors TR1, TR2 which are connected as a differential amplifier. Briefly, the voltage excursions provided by the sliding arm on potentiometer P1 are connected to base B2 of transistor TR2, and the voltage excursion provided by the effective arm of the potentiometer P2 are coupled to base B1 of transistor TR1 in the detector circuit DC.

*IV. Detector circuit (DC)*

The detector circuit is comprised of a two-stage differential amplifier detector circuit including transistors TR1, TR2, TR3, TR4. As indicated above, the variable signal provided by the telemetering device over the sliding arm of potentiometer P1 is connected to the detector circuit DC for amplification by transistor TR2 and TR3, and the signal provided by the stepping potentiometer P2 is coupled to the detector circuit DC for amplification by transistors TR1, TR4.

A micropositioner relay, commercially available, comprises two coil members L, L2, coil windings L1, being connected in the output circuits of the amplifiers TR3 and coil winding L2 being connected in the output circuit of amplifier TR4, whereby conduction by amplifier TR3 effects energization of coil L, and conduction by amplifier TR4 effects energization of coil L2. Coil L1 at its contacts BCR (FIGURE 2) controls operation of raise relay R in the drive circuit DRC for the chains, and coil L2 at its contacts BCC (FIGURE 2) controls operation of lower relay L on the chain drive circuit.

The detector circuit DC is adjusted so that ¾ of a mil volt difference between the signals coupled to the bases B1, B2 will effect energization of one of the coils L1, L2 in the micropositioner. An increase in the analog signal provided by potentiometer P1 effects operation of coil L1, and a decrease in the signal provided by potentiometer P1 results in energization of coil L2.

Energization of either coil L1, L2 will result in the operation of the drive circuit DRC for the purpose of operating the counting chain circuits UCC, TCC, HCC ind THCC as necessary to reestablish zero output by the detector circuit.

*V. Drive circuit (DRC)*

The drive circuit DRC (FIGURE 2) which is connected to the output of the detector circuit DC, is operative to drive the chains to achieve signal balance, and includes a raise relay R, a lower relay L and disconnect relay D (FIGURE 2), the disconnect relay D operating with relays L or R and as a self-interrupting stepper until such time as the operated ones of the contacts BCR or BCL are opened to interrupt the stepper circuit. Contacts BCR in the detector circuit as closed by coil L1 control the drive circuit to operate the counting chains in a forward direction, and contacts BCL as closed by coil L2 control the drive circuit to step the counting chains in a reverse direction.

*VI. Counting chains*

As noted above, the converter includes a thousands counting chain THCC, a hundreds counting chain HCC, a tens counting chain TCC and a units counting chain UCC for controlling the stepping potential P2 to provide a signal which balances the input analog signal on potentiometer P1. The units counting chain UCC (FIGURE 3) includes ten units counting relays, U0–U9 and their associated contacts; tens counting chain TCC (FIGURE 4) includes ten counting relays T0–T9, and their associated contacts; hundreds counting chain HCC (FIGURE 5) includes ten hundreds counting relays H0–H9 and their associated contacts; and thousands counting chain THCC (FIGURE 6) including relays TH0–TH1 and their associated contacts.

Each of the chains is reversible, and the hundreds, tens, and units chains are of the ring type.

As noted heretofore, the contacts 1–3 on the units relay U1 control the insertion of resistance RU1 in the upper or lower leg of potentiometer P2; contacts 1–3 of tens relays T1 control the insertion of resistance RT1 in the upper or lower leg of potentiometer circuit P2; contacts 1–3 of hundreds relay H1 control the insertion of resistance RH1 in the upper and lower leg of potentiometer circuit P2 . . . etc.

*VII. Initial setting of relay chains*

Assuming no analog input, the chains are operative to a start position as the power is turned on by closing switch PS (FIGURE 1) circuits being completed to operate thousands relay TH0, hundreds relay H0, tens relay T9, and units relay U0. In the present example the relays are operated to initially set the bridge circuit of FIGURE 1 at a reading of 0090. The setting of the tens digit at "9" instead of "0" operates tens relay T9 which makes for greater circuit simplicity as will be appreciated more fully by further consideration of the circuitry herein.

The paths for operating these relays are as follows:

Thousands relay TH0 (FIGURE 6) operates over the path extending from the + (zero volt) conductor (FIGURE 2), contacts TH0–5, TH1–5, a directional diode in the conducting direction, conductor 4 (FIGURE 2 to FIGURE 6), coil of relay TH0 to the −48 volt conductor. Relay TH0 locks to the raise hold circuit over a circuit extending from the plus conductor (FIGURE 3) over contacts L–7, D15, R21, C15 (FIGURE 3 to FIGURE 6), TH1–7, TH0–8, coil of TH0, to −48 volt. Relay TH0 also locks to the lower hold circuit over a path extending from the zero volt plus conductor (FIGURE 3) over contacts R–7, D10, R16, C11 (FIGURE 3 to FIGURE 6), TH0–7, coil of relay TH0, to −48 volts.

Hundreds relay H0 (FIGURE 5) operates over the path extending from zero volt conductor (FIGURE 2) over contacts H0–5, H1–5, H2–5, H3–5, H4–5, H5–5, H6–5, H7–5, H8–5, H9–5, diode D5, conductor C5 (FIGURE 2 to FIGURE 5), winding of relay H0 to −48 volt. Relay H0 locks over the raise hold circuit which extends from zero volt (FIGURE 3) over contacts L–7, D16, R22, conductor C16 (FIGURE 3 to FIGURE 5), H0–8, H1–6, coil of H0, to −48 volt. Relay H0 also locks to the lower hold circuit over a path extending from the zero volt plus conductor (FIGURE 3) over contacts R–7, D11, R17, C12 (FIGURE 3 to FIGURE 5), H9–9, H0–7, coil of relay H0 to −48 volts.

Tens relay T9 (FIGURE 4) operates over the path which extends from zero volt conductor (FIGURE 2) over contacts T0–5, T1–5, T2–5, T3–5, T4–5, T5–5, T6–5, T7–5, T8–5, T9–5, conductor C6 (FIGURE 2 to FIGURE 4), coil of relay TR to −48 volt. Relay T9 locks over the raise hold circuit which extends from zero volt conductor (FIGURE 3) over contacts L–7, D17, R23, C17 (FIGURE 3 to FIGURE 4), T0–6, T9–8, coil of T9, to −48 volt. Tens relay T9 also locks to the lower hold circuit over a path extending from the zero volt plus conductor (FIGURE 3) over contacts R7, D12, R18, C13 (FIGURE 3 to FIGURE 4), T9–7, T8–9, coil of relay T9, to −48 volts.

Units relay U0 (FIGURE 3) operates over the path which extends from zero volt conductor (FIGURE 2) over contacts U0–5, U1–5, U2–5, U3–5, U4–5, U5–5, U6–5, U7–5, U8–5, U9–5, diode D6, conductor C7 (FIGURE 2 to FIGURE 3), coil of relay H0 to −48 volt. Relay U0 locks over the raise hold circuit which extends from zero volt conductor (FIGURE 3) over contacts L–7, D18, R24, U0–8, U1–6, coil of U0, to −48 volt.

Units relay U0 also locks to the lower hold circuit over a path extending from the zero volt plus conductor (FIGURE 3) over contacts R7, D13, R19, U9–9, U0–7, and the coil of relay U0 to —48 volts.

Also preparation relay A (FIGURE 7) operates over the path which extends from zero volt conductor, over contacts R26, B1–2, B2–2, B3–2, B4–2, B5–2, A–3, coil of A, to —48 volt. Relay A locks over A–4, Al–4, C10 (FIGURE 7 to FIGURE 13), R15, D9, R–7, and D–4 in parallel to zero volt.

Referring to the right side of the bridge circuit BC (FIGURE 1), a circuit can be traced from —6 volts, TH0–3, H0–3, T0–2, RT1, T1–2, RT2, T2–2, RT3, T3–2, RT4, T4–2, RT5, T5–2, RT6, T6–2, RT7, T7–2, RT8, T8–2, RT9, T9–3, U0–3, to the base *b1* of transistor TR1 with a total of 0090 ohms therein.

From the base *b1* of transistor TR1, a circuit can be traced from *b1*, contacts U0–1, RU1, U1–2, RU2, U2–2, RU3, U3–2, RU4, U4–2, RU5, U5–2, RU6, U6–2, RU7, U7–2, RU8, U8–2, RU9, U9–2, T9–1, H0–1, RH1, H1–2, RH2, H2–2, RH3, H3–2, RH4, H4–2, RH5, H5–2, RH6, 6–2, RH7, H7–2, RH8, H8–2, RH9, H9–2, TH0–1, RTH1, TH1–2 to —4 volts. This base *b1* may be considered as connected to the sliding arm of potentiometer P2 in the right side of the bridge.

The converter circuit is thus provided with a starting position which provides a digital output of 0090.

*VIII. Fast scan circuit (FSC)*

A fast scan control circuit FSC for effecting rapid adjustment of the chains to the value of the analog signal first coupled to the input circuit includes hundreds fast scan completed relay HF and tens fast scan completed relay TF. A start circuit extends to the hundreds counting chain, as shown more fully hereinafter, to start the chain setting in the hundreds chain whenever a fast scan is desired.

*IX. Deviation circuit*

With reference to FIGURES 6 and 7, deviation circuits are provided for measuring the number of incremental directions from the last readout value, and for initiating automatic reporting responsive to the detection of a predetermined number. The number to be detected is preadjustable to different values.

As shown in FIGURES 6 and 7, a deviation set switch DSS comprises a ten point switch which is manually adjustable to each of ten different positions, the position selected determining the number of deviations which must occur prior to operation of deviation relay DR. A deviation counting chain (FIGURE 7) includes preparation relay A, counting relays B1–B5, and chain repeat relay C. The chain is operatively controlled by the chain circuit (FIGURE 2) to count the incremental changes which occur after each readout value, and whenever the total changes in a given direction reset the value preselected by deviation set switch DSS, the deviation reached relay DR is operated to close contacts DRC and transmit a signal over conductor DR to the associated equipment.

In the present system, a deviation read-back signal relay DV (FIGURE 8) is controlled by contacts in the controlled station common equipment to indicate that the equipment is ready to receive the digital output signal provided by the converter.

The output signals in digit form are provided by the digital output conductors shown in FIGURE 8, the contacts on the operated ones of the relays in the thousands, hundreds, tens and unit relays being closed to provide the digital markings thereon. Since the relays operated in the chains to match the analog signal, the digits represented thereby will provide a digital reading of the analog input.

As noted heretofore, with closing of switch PS to connect power to the converter AD, the chains immediately operate to provide the digital output "0090." In addition, circuits are completed to operate fast relay A (FIGURE 7) and slow operate relay B (FIGURE 6). Relay A operates from the circuit extending from zero volt conductor over contacts R26, B1–2, B2–2, B3–2, B4–2, B5–2, A–3, coil of relay A to —48 volts and locks over contacts A–4 and AL–4 to the lower hold conductor. Later relay A may lock over contacts AL–5 to the raise hold conductor. Slow operate relay B is connected to operate through break contacts L–10, TD–8, R–8, and HF–7 if these contacts all remain closed, as is the case if the analog signal corresponds to 0090 upon closure of the power switch PS. Alternatively, a circuit is completed to relay B with contacts L–10, TF–8 and HF–8 closed.

*X. Specific description of circuit operation*

Briefly stated, the novel converter is operative to convert analog values into a digital and decimal output which can be used for control, display and remote indications. Of import, is the fact that the converter may be connected "on-line" and is operative to provide a changing digital output as changes occur in the analog input.

In operation, the analog signals are converted into a proportional voltage and coupled over potentiometer P1 to the null detector DC. A stepping potentiometer P2 is also connected to the null detector DC, and in the event there is a difference in the signal output of the potentiometers P1 and P2, an error signal is provided by the detector DS to the drive circuit DRC which drives the counting chains until the signal output of potentiometer P2 balances the output of potentiometer P1. The setting of the relays drive chains at such time provides the digital output.

In normal "on-line" operation, the chains have one step at a time in the smallest available increment. However, in initial operation the hundreds digits chain is operated first, the tens digit chain is operated next, and the units digit chain is operated last to provide the initial balance quickly. After initial balance is reached, the counting chain reverts to normal on-line stepping.

Although the digital output may be supplied continuously, in some instances it may be desirable to limit reporting to instances when a predetermined total change has occurred, or whenever a change occurs at a predetermined rate.

In such arrangement, a deviation circuit counts the number of incremental changes which occur after a readout, and depending upon the setting on the deviation set switch, the deviation circuit effects a new read-out as the preselected number of deviations occur.

When a readout is taken the detector circuit is inhibited until the readout is completed, and the deviation circuit is reset to zero to permit the initiation of a new count as soon as reclose is completed.

The specific manner in which these and other operations are accomplished will now be set forth in detail.

For exemplary purposes it is first assumed that the telemetered device at the pumping station has adjusted the slider of potentiometer P1 so that at the time of closure of power switch S to couple power to the bridge circuit, the potentiometer P1 connects 1803 ohms resistance between the slider and the —6 volt conductor. Although this illustrated setting would not ordinarily be encountered in a gas or liquid pumping station, it is chosen to illustrate the extreme flexibility and capability of the novel analog to digital converter AD.

*XI. Detection of differential*

The detector circuit DC is operative with such condition to provide a difference output signal to the drive cricuit DCR to effect the operation thereof and the chains in search of a signal balance. That is, with the occurrence of such condition the slider arm of potentiometer P1, which is connected to the base *b2* of transistor TR2, is at a potential of 1803/2000 of 2 volts or 1.803 volts less negative than the —6 volt conductor (i.e., —4.197 v). As noted heretofore, the chains are operative responsive to initial energization of the circuit by closure of switch S, to adjust to the reading 0090 (relays TH0, T10, T9 and V0 operated), and as a result, the resistances which are connected in the lower and upper arms of bridge circuit BCK provide a potential over the slider of potentiometer P2 to base *b*1 of transistor TR1 (0090/2000) (2 volts) or .090 volt less negative than the −6 volt conductor (i.e., −5.910 volts).

Referring to the right side of the bridge circuit BC (FIGURE 1), a circuit can be traced from −6 volt, TH0–3, H0–3, T0–2, RT1, T1–2, RT2, T2–2, RT3, T3–2, RT4, T4–2, RT5, T5–2, RT6, T6–2, RT7, T7–2, RT8, T8–2, RT9, T9–3, U0–3, to the base *b*1 of transistor TR1 with a total of 0090 ohms therein.

From the base *b*1 of transistor TR1, a circuit can be traced from *b*1, contacts U0–1, RU1, U1–2, RU2, U2–2, RU3, U3–2, RU4, U4–2, RU5, U5–2, RU6, U6–2, RU7, U7–2, RU8,U8–2, RU9, U9–2, T9–1, H0–1, RH–1, H1–2, RH2, H2–2, RH3, H3–2, RH4, H4–2, RH5, H5–2, RH6, H6–2, RH7, H7–2, RH8, H8–2, RH9, H9–2, TH0–1, RTH1, TH1–2 to −4 volt. This base *b*1 may be considered as connected to the sliding arm of potentiometer P2 in the right side of the bridge.

The converter circuit is thus provided with a starting position which provides a digital output of 0090.

Since emitters *e*1 of TR1 and *e*2 of TR2 are connected to the zero volt conductor over similar resistance values comprising equal portions of potentiometer P3, resistor R3, and contacts DV–1, R–1, and L–1, and with base *b*1 of TR1 at −5.910 volts and base *b*2 at −4.197 volts, considerably more current will flow in the emitter-collector path of TR1 than flows in the emitter-collector path of TR2. Accordingly, the collector C1 of TR1 which is connected to base *b*4 of transistor TR4 will be considerably less negative than the collector C2 which is connected to the base *b*3 of transistor TR2.

With base *b*4 of transistor TR4 considerably less negative than the base *b*3 of transistor TR3, more current will flow in the emitter-collector path of transistor TR3 than in the emitter-collector path of transistor TR4, and more current flows through the coil L1 than through the coil L2 of the Barber-Coleman micropositioner relay.

With the operation and energization of coil L1, contacts BCR (FIGURE 2) will close to operate the raise relay R. As shown in other examples hereinafter, if more current flows through coil L2 than through L1, contacts BCL (FIGURE 2) close to operate lower relay L. If the currents through the two coils L1 and L2 are equal, contacts BCR and BCL are both open.

It might be noted at this point that the series circuit between the collectors C1 and C2 comprising resistor R5 and variable resistor VR2 is for the purpose of adjusting the sensitivity of the detector so that ¾ to 1, millivolt change between the sliders of potentiometers P1 and P2 (and therefore bases *b*1, *b*2) will cause contacts BCR or BCL to close. Potentiometer P3 connected between the transistors TR1, TR2 enables a fine balance to be achieved to compensate for differences in transistor characteristics in either stage of amplification, or any minor unbalances of the bridge itself.

It is apparent from the foregoing description that a difference in signal outputs on the slider arms of potentiometers P1 and P2 will result in the provision of a difference signal by detector circuit DC and the operation of relay L1 or L2 to effect closure of the raise contacts BCR or the lower contacts BCL.

*XII. Fast scan*

As noted herebefore, it is desirable as the power is originally turned on, to effect a fast adjustment of the system to the value of the signal provided by the telemetered device. Assuming the condition where the analog input is 1803 ohms as the unit is energized the novel circuit AD effects a fast scan operation of the counting chains to bring about a balance of the bridge circuit BC in FIGURE 1. Such scan basically comprises an upward stepping of the hundreds counting chain HCC until the input set value (1803) has been exceeded, a downward stepping of the tens counting chain TCC below the set value (1803), and an upward stepping of the units counting chain UCC until the set value (1803) is reached. Such scan is basically accomplished by the drive circuit DRC (FIGURE 2) including relays R or L and D which are energized as a result of the receipt of the difference signal and operate as a self-interrupting stepper until the Barber-Coleman contacts BCR and BCL open to interrupt the operator.

More specifically, in the present example, as the detector circuit DC closes contacts BCR–1 (FIGURE 2) to indicate that the count must be raised, relay R operates over a circuit extending from the zero volt conductor (FIGURE 2) on break contacts TH1–12, H9–16, and U9–16 in parallel, coil of relay R, contacts BCR–1, D–1, to −48 volt; and locks from zero volt conductor over the circuit including contacts R–2, coil of R, R–3, D–1, to −48 volt.

Raise relay R operates and at its contacts R–6 (FIGURE 3) operates the hundreds chain relay H1 over a circuit which extends from zero volt conductor over contacts R–6, D–3, conductor C9 (FIGURE 3 to the right side of FIGURE 4), contacts HF–6, conductor 22 (FIGURE 4 to FIGURE 5), contacts H9–12, H0–13, coil of H1, to −48 volt; at its contacts R4 (FIGURE 2) energizes slow-to-operate disconnect relay D over a circuit extending from zero volt conductor over contacts R–4, coil D, to −48 volt; at its contacts R–1 (FIGURE 1) opens the circuit to the coils L, L2 of the Barber-Coleman relay; at its contacts R–5 (FIGURE 2) closes a circuit which is incidental at this time; and at its contacts R–7 (FIGURE 3) opens its contacts in the lower hold circuit.

Hundreds chain relay H1 operates and at its contacts H1–8 (FIGURE 5) locks to the raise hold circuit over the path which extends from the zero volt conductor (FIGURE 3) over contacts L–7, diode D16, R22, conductor 16 (FIGURE 3 to FIGURE 5), contacts H2–6, H1–8, coil of H1, to −48 volt; at its contacts H1–6 (FIGURE 5) opens the raise hold circuit of hundreds chain relay H0 which then hold over contacts H0–7, H9–9, C12 (FIGURE 5 to FIGURE 3), R17, D11, D–4 to the zero volt conductor to the lower hold circuit until disconnect relay D operates; at its contacts H1–7 prepares its lower hold circuit; at its contacts H1–9 opens a point in the lower hold circuit of relay H2 which is not operated at this time; at its contacts H1–10 opens a point in the lower drive circuit of relay H9; at its contacts H1–11 prepares a lower drive circuit to relay H0; at its contacts H1–12 opens a point in the forward drive circuit of relay beyond relay H2; and at its contacts H1–13 prepares a forward drive circuit to relay H2.

Slow to operate disconnect relay D (FIGURE 2) operates, and at its contacts D–4 (FIGURE 3) opens the lower hold circuit, releasing relay H0 (FIGURE 5); and at its contacts D–1 (FIGURE 2) opens the circuit of relay R which releases after an interval determined by the circulating current over diode D7 and resistor R8.

Raise relay R releases and at its contacts R4 (FIGURE 2) releases relay D; and at its contacts R–1 (FIGURE 1) re-establishes the circuit from the zero volt conductor to the detector circuit DC. If the bridge is still unbalanced the different signals maintain the coil L1 in the detector circuit operative and the contacts of the Barber-Coleman relay reoperate.

*XIII. Hundreds scan*

As the result of the operation of hundreds relay H1 and the release of relay H0, the stepping potentiometer P2 is adjusted to a new value. That is, it will be recalled that (absent an analog input on potentiometer P1) the setting of the chain as the result of energization of the converter by closure of switch PS is 0090. In such condition resistances R71–R79 are connected in the circuit and the total value of resistance is (9) (10)=90 ohms.

In the present example, with hundreds chain relay H0 released and relay H1 operated, a circuit can be traced from −6 volt (FIGURE 1), TH0–3, H0–2, RH1, H1–3, T0–2, RT1, T1–2, RT2, T2–2, RT3, R3–3, RT4, T4–2, RT–5, T5–2, RT6, T6–2, RT7, T7–2, RT8, T8–2, RT–9, T9–3, 10–3 to base *b*1 of transistor TR1. As RH1, which is 100 ohms is now serially included with the 90 ohms normally inserted as the circuit is energized, the circuit from −6 volt conductor to *b*1 contains 0190 ohms.

A circuit can also be traced from base *b*1, U0–1, RU1, U1–2, RU2, U2–2, RU3, U3–2, RU4, U4–2, RU5, U5–2, RU6, U6–2, RU7, U7–2, RU8, U8–2, RU9, U9–2, T9–1, H1–2, RH2, H2–2, RH3, H3–2, RH–4, H4–2, RH5, H5–2, RH6, H6–2, RH7, H7–2, RH8, H8–2, RH9, H9–2 TH0–1 RTH1–1 TH1–2, to −4 volt. In effect, therefore, the slider base *b*1 of TR1 has been moved up 100 ohms so that the potential thereon is 0190/2000 of 2 volts or .190 volt less negative than the −6 volt conductor (i.e., −5.810 volts).

However, since more than ¾ of a millivolt difference still exists between the sliders of potentiometers P1 and P2, and in the same direction as relay R releases, and contacts R–1 (FIGURE 1) reclose, and coil L1 is energized to close raise contacts BCR to the raise relay in the drive circuit DRC.

With contacts BCR–1 and D–1 open, raise relay R reoperates, and at its contacts R4 energizes disconnect relay D, and at its contacts R6 operates hundreds chain relay H2 over a path which extends from the zero volt conductor (FIGURE 3), over contacts R–6, D3, C9 (FIGURE 3 to FIGURE 4), HF–6, C22 (FIGURE 4 to FIGURE 5), H9–12, H0–12, H1–13, coil of H2, to −48 volt. Relay H2 operates and at contacts H2–8 locks to the raise-hold circuit over break contacts H3–6 of relay H3, and at contacts H2–7 locks to the lower hold circuit over break contacts H1–9 of relay H1.

Drive circuit relays R and D continue to pulse in this manner, and the hundreds counting chain HCC continues to advance upwardly to insert additional resistances RH2, RH3, etc., in the bridge in an attempt to advance the stepping potentiometer P2 to provide a signal in excess of that provided by the telemetered device. The chain advances in this manner to hundreds chain relay H9 which operates and locks, and with the next closure of contacts R–6 (FIGURE 3) relay H0 reoperates over the path extending from the zero volt conductor over contacts R–6, D–3, C9 (FIGURE 3 to FIGURE 4), HF–6, C22 (FIGURE 4 to FIGURE 5), H9–13, H8–12, D27, coil of H0 to −48 volt. Thousand relay TH1 is also energized over a circuit extending from the zero volt conductor over contacts H9–13, H8–12, C24 (FIGURE 5 to FIGURE 6), TH0–6, and the coil of TH1, to −48 volt.

Thousands relay TH1 operates and at its contacts TH1–3 (FIGURE 1) connects the resistance RTH1 in the bridge circuit, at its contacts TH1–8 (FIGURE 6) locks to the lower hold circuit; at its contacts TH1–9 (FIGURE 6) locks to the raise hold circuit; at its contacts TH1–5 (FIGURE 2) further opens the fast scan operating circuit of relay TH0 which was previously opened by contacts TH0–5; at its contacts TH1–6 prepares a reverse stepping circuit for relay TH0; and at its contacts TH1–7 opens the raise hold circuit path of relay TH0 in preparation for its release.

When disconnect relay D operates as the result of the continued stepping of the drive circuit DRC, contacts D–4 (FIGURE 3) in the lower hold circuit are opened to release hundreds relay H9 and thousands relay TH0. at this time, the bridge leg includes resistance in the order of 1090 ohms (RTH1 and RT1–RT9).

The next operation of raise relay R effects closure of contacts R–6 (FIGURE 3) to reoperate relay H1 over the path previously traced.

As the pulsing of drive circuit relays R and D continues, the hundreds counting chain is now advanced to transfer the 100 ohms resistance RH1, etc., from an upper leg into a lower leg of the bridge, each step in such direction effecting the transfer of an additional resistance from an upper leg to a lower leg in an attempt to provide a signal output for potentiometer P2 which is greater than the value provided by the potentiometer P1.

As the chain advances to hundreds relay H8, a circuit can be traced from −6 volt, TH0–2, RTH1, TH1–3, H0–2, RH1, H1–2, RH2, H2–2, RH3, H3–2, RH4, H4–2, RH5, H5–2, RH6, H6–2, RH7, H7–2, RH8, H8–3, T0–2, RT1, T1–2, RT2, T2–2, RT3, T3–2, RT4, T4–2, RT5, T5–2, RT6, T6–2, RT7, T7–2, RT8, T8–2, RT9, T9–3, U0–3, to the base *b*1 of transistor TR1. From the base *b*1 a circuit can be traced through U0–1, RU1, U1–2, RU2, U2–2, RU3, U3–2, RU4, U4–2, RU5, U5–2, RU6, U6–2, RU7, U7–2, RU8, U8–2, RU9, U9–2, T9-1, H8–1, RH9, H9–2, TH1–1, to −4 volt The potential of base *b*1 is now 1890/2000 of 2 volts or 1.890 volts less negative than the −6 volt conductor or −4.110 volts. Thus the voltage of collector C1 is more than ¾ of 1 millivolt less negative than collector C2, and with the release of contacts R–1 (FIGURE 1), in the next step of the drive circuit, the coil L1 of the Barber-Coleman relay conducts less current than coil L2 causing closure of lower contacts BCL (FIGURE 2). With the release of disconnect relay D in the stepping circuit, lower relay L operates from a circuit extending from zero volt conductor over contacts TH0–5, H0–5, and T0–5 and associated rectifiers in parallel, over conductor C1, the coil of L and contacts BCL–1, D–1, to −48 volt.

At this time the bridge has 1890 ohms connected therein, and the reading provided by the telemetered device is 1803. It is necessary, therefore, for the signal output of stepping potentiometer P2 to be lowered, and the converter AD is now operative to effect such change.

*XIV. Tens scan*

More specifically, lower relay L operates and locks over a circuit extending from the zero volt conductor over contacts L–2, coil of L, contacts L–3, D–1, to −48 volt; at its contacts L–1 (FIGURE 1) opens the detector circuit releasing the relay L1 which opens its contacts BCL–1; at its contacts L–5 (FIGURE 2) operates hundreds fast scan complete relay HF over a path which extends from the zero volt conductor, over contacts L–5, HF–1, coil of HF, to −48 volt; at its contacts L–8 operates tens relay T8 which extends from the zero volt conductor (FIGURE 3) over contacts L–8, D–6, TF–5, D20, C19 (FIGURE 3 to FIGURE 14), T0–10, T9–11, coil of T8, to −48 volt; and at its contacts L–4 (FIGURE 2) operates disconnect relay D.

Hundreds fast scan complete relay HF operates, and locks over resistor R10 and contacts HF–2 which close before contacts HF–1 open.

Relay D operates and at its contacts D–5 (FIGURE 3) releases relay T9 (as relay T8 at its contacts T8–9 has previously opened the lower hold circuit of relay T9); and at its contacts D–1 releases relay L.

As tens relay T8 restored, it was effective at its contacts T8–3 to remove the ten ohm resistance RT8 from the bridge leg, which now has a total value of 1880 ohms. Since this is still larger than the reading 1803 ohms provided by the telemetered device, relay L in releasing at its contacts L–1 (FIGURE 1) effects energization of coil L2 and the reoperation of contacts BCL; and at its contacts L–4 (FIGURE 2) releases relay D. Relay D in releasing reoperates relay L.

Relay L operates and at its contacts L1 releases contacts BCL; at its contacts L–8 operates relay T7 over a circuit extending from the zero volt conductor over contacts L–8, D–6, TF–5, D20, C19 (FIGURE 3 to FIG- URE 4), T0–10, T9–10, T8–11 and the coil of T7 to −48 volt; and at its contacts L4 operates relay D.

Relay T7 operates and at its contacts T7–8 and T7–7 locks to the raise and lower hold circuit respectively; at its contacts T7–9 (FIGURE 4) opens the lower hold circuit of relay T8 in preparation for its release; at its contacts T7–11 prepares for the operation of relay T6. As relay D operates, it is effective at its contacts D–5 to release relay T8; and at its contacts D–1 releases relay L.

In this fashion the drive circuit DRC steps the tens chain downwardly, each step down effecting the transfer of an additional ten ohms of resistance. As relay T0 operates, the total resistance value on the bridge leg BCK will have been reduced to 1800 ohms. The circuit at this time extends from −6 volt over contacts TH0–2, RTH1, TH1–3, H0–2, RH1, H1–2, RH2, H2–2, RH3, H3–2, RH4, H4–2, RH5, H5–2, RH6, H6–2, RH7, H7–2, RH8, H8–3, T0–3 and U0–3 to base *b*1 of transistor TR1. From the base *b*1, a circuit can also be traced over contacts U0–1, RU1, U1–2, RU2, U2–2, RU3, U3–2, RU4, U4–2, RU5, UT–2, RU6, U6–2, RU7, U7–2, RU8, U8–2, RU9, U9–2, T0–1, RT1, T1–2, RT2, T2–2, RT3, T3–2, RT4, T4–2, RT5, T5–2, RT6, T6–2, RT7, T7–2, RT8, T8–2, RT9, T9–2, H8–1, RH9, H9–2, TH1–1, to −4 volt.

Thus the potential of base *b*1 will be found at 1800/2000 of 2 volts, or 1,800 volts less negative than the −6 volt conductor (−4.200 volts). The collector C1 is now more than ¾ of 1 millivolt more negative than collector C2 with the result that upon the release of contacts L–1 (FIGURE 1), the coil L1 conducts more current than coil L2, causing closure of contacts BCR (FIGURE 2). With the subsequent release of relay D therefore, the raise relay R operates to initiate a search for the resistance values required to balance the bridge.

*XV. Units scan*

Since the bridge leg has 1800 ohms at this time, and three additional ohms are required, the units chain is now advanced one step at a time, each step inserting 1 ohm resistance in the circuit in search of a balanced bridge.

Units relay R operates and locks over its own contacts R2; at its contacts R–1 (FIGURE 1) opens the detector circuit to release the Barber-Coleman relay which opens its contacts BCR; at its contacts R5 (FIGURE 2) operates tens fast scan complete relay TF over a circuit extending from zero volt conductor over contacts HF–2, R–5, D–2, TF–1, the coil of relay TF, to −48 volt; at its contacts R6 operates relay U1 over a circuit extending from zero volt conductor (FIGURE 3) over contacts R–6, D–3, HF–4, U9–12, U0–13, coil of U1, to −48 volt; and at its contacts R–4 (FIGURE 2) operates relay D. Relay TF operates and locks over TF–2, R10, and HF–2, to 0 volt.

Disconnect relay D operates and at its contacts D–1 (FIGURE 2) releases relay R. Raise relay R releases and at its contacts R4 (FIGURE 2) releases relay D. With operation of units relay U1 and closure of contacts U1–3, resistance RU1 (1 ohm) is inserted in the bridge. However, since three ohms are required a bridge unbalance of more than ¾ of 1 millivolt still exists, and relay R at its contacts R–1 (FIGURE 1) effects the reoperation of contacts BCR. That is, at this time base *b*1 would be found at a potential of 1801/2000 of 2 volts or 1.801 volts less negative than the −6 volt conductor or −4.199 volts whereas the slider of potentiometer P1 is still at −4.197 volts.

Accordingly, disconnect relay D reoperates raise relay R, and raise relay R at its contacts R1 effects the release of contacts BCR; and at its contacts R–6 (FIGURE 3) operates units chain relay U2 over a circuit extending from zero volt conductor over contacts R–6, D–3, HF4, U9–12, U0–12, U1–13, coil of U2, to −48 volt; and at its contacts R–4 energizes disconnect relay D. Relay U2 operates and at its contacts U2–3 transfers resistance RU2 (1 ohm) into the bridge, whereby the bridge leg now has 1802 ohms connected therein.

Disconnect relay D operates, and at its contacts D1 releases relay R; and at its contacts D–4 (FIGURE 3) releases relay U1, this being possible because contacts R–7 (FIGURE 3) and U2–6 (FIGURE 3) are both open.

As relay R releases, current flow through coil L2 effects the reoperation of contacts BCR due to the 1 millivolt difference in potential which still exists between the sliders of P1 and P2 (1802 ohms and 1803 ohms, respectively).

Relay D releases, and with contacts BCR closed, effects the reoperation of relay R. Relay R operates and at its contacts R1, effects the release of contacts BCR; at its contacts R6 operates relay U3 over a circuit extending from zero volt conductor over contacts R–6, D–3, U9–12, U0–12, U1–12, U2–13, coil of U3, to −48 volt; and at its contacts R4 energizes relay D.

With units chain relay U3 operated, a circuit can be traced from −6 volt, TH0–2, RTH1, H0–2, RH1, H1–2, RH2, H2–2, RH3, H3–2, RH4, H4–2, RH5, H5–2, RH6, H6–2, RH7, H7–2, RH8, H8–3, T0–3, U0–2, RU1, U1–2 RU2, U2–2, RU3, U3–3, to base *b*1 of transistor TR1. From base *b*1, a circuit can be traced through U3–2, RU4, U4–2, RU5, UT–2, RU6, U6–2, RU7, U7–2, RU8, U8–2, RU9, U9–2, T0–1, RT1, T1–2, RT2, T2–2, RT3, T3–2, RT4, U4–2, RT5, T5–2, RT6, T6–2, RT7, T7–2, RT8, T8–2, RT9, T9–2, H8–1, RH9, H9–2, TH1–1, to −4 volt.

Accordingly, base *b*1 of transistor TR1 will be found at a potential of 1803/2000 of 2 volts or 1,803 volts less negative than the −6 volt conductor or −4.197 volts which is the same potential of slider P1.

Relay D operates, and at its contacts D–4 (FIGURE 3) releases relay U2, and at its contacts D1 releases relay R. Relay R releases, and at its contacts R–1 (FIGURE 1) re-establishes the test circuit throughout the position relay in the detector circuit; and at its contacts R4 releases relay D.

When the detector circuit is re-established, equal currents flow through coils L1 and L2 of the micropositioner relay. Because of the balanced condition of the bridge circuit, contacts BCR do not reoperate; and contacts BCL remain non-operated.

Accordingly when disconnect relay D in the chain circuit DRC releases, the closure of contacts D–1 (FIGURE 2) prepares the circuits of relays R and L, but neither relay operates because contacts BCR and BCL are open.

In brief review, the fast scan consists of a searching operation by the detector circuit DC, drive circuit DRC and counting chains UCC, TCC, HCC, THCC, the chains operating to insert different values of resistance into a bridge until a condition is reached in which the resistance provided in one bridge circuit matches the resistance in another bridge circuit which, in turn, represents the telemetered quantity. In the present example, the quantity was represented by a resistance leg of 1803 ohms in potentiometer P1, and the chains were operative to insert a comparable resistance in the stepping potentiometer P2. The resultant position of the chains is therefore indicative of the value of the input signal and the converter provides digital output signals representative thereof.

*XVI. Reporting after fast scan*

It will be recalled that relay DR (FIGURE 6) operated through contacts TF–9 and locked through contacts DR–1.

Relay DR at its contacts DR–8 (FIGURE 8) prepared the output call signal circuit which is designated "Output Reporting Signal Circuit DR." However, the output reporting signal circuit is held open by relays HF and TF until these relays operate so that the analog to digital converter will have a chance to arrive at balance before the digital readout is accepted.

It will also be recalled that relay HF operates after the hundreds fast scan (relay L operates relay HF) and that relay TF operates after the tens fast scan (relay R operates relay TF) to initiate advance of the units chain.

At this time, the output reporting signal circuit to the transmitter and controlled station equipment is completed over contacts DR–8, HF–9, and TF–10.

After a short interval which allows the units chain to run up to the balance point, contacts CSE (FIGURE 8) close in the controlled station equipment to operate deviation ready back relay DV over an obvious circuit. At this time the controlled station equipment obtains a read out from the digital output leads (see FIGURE 8).

Ready back relay DV operates, at at its contacts DV–1 (FIGURE 1) opens the detector circuit to prevent closure of the contacts BCR and BCL, and accordingly no further stepping of the counting chains can occur during readout; and at its contacts DV–3 (FIGURE 7) opens the —48 volt supply to the deviation counting chain (relays B1–B5—FIGURE 7) to reset the deviation counting chain which has been running incidentally during the fast scan operation; and at its contacts DV–2 (FIGURE 6) opens the circuit to relay DR to release such relay. As relay DV operates, the controlled station is ready to receive the digital output signals of FIGURE 8.

The following digital output circuits to the controlled station can then be traced, and, as hereinbefore described, the controlled station reports such values to the control station and updates the in-line display thereat to provide the reading of 1803 thereon.

(1) 0 volt, TH1–10 }
(2) 0 volt, TH1–11 } ---------- 1
(3) 0 volt, H8–14 }
(4) 0 volt, H8–15 } ---------- 8
(5) 0 volt, T0–14 }
(6) 0 volt, T0–15 } ---------- 0
(7) 0 volt, U3–14 }
(8) 0 volt, U3–15 } ---------- 3

It should be appreciated that the thousands register in the controlled station telemetering transmitter (FIGURE 1A) is comprised of five relays, and that the signals 1 and 2 above selectively pull 2 out of 5 of these relays in a 2 out of 5 code; that the hundreds register is comprised of five relays, two of which are selectively pulled by circuits 3 and 4 above; that the tens register is comprised of five relays, two of which are selectively pulled by circuits 5 and 6; and that the units register is comprised of five relays, two of which are selectively pulled by circuits 7 and 8.

If decimal to decimal output reporting (instead of decimal to 2 out of 5) is desired, single decimal outputs instead of pairs of outputs may be used for the various decimal digits.

Referring to FIGURE 2, the lamps shown therein constitute an in-line display at the compressor station (FIGURE 10) and although these lamps may function incidentally during fast scan, thousands lamp 1, hundreds lamp 8, tens lamp 0, and units lamp 3 will be found illuminated after fast scan over the following circuits:

Thousands lamp 1 ---- 0 volt, TH0–5, TH1–4, lamp 1, R11, —48 volt.
Hundreds lamp 8 ----- 0 volt, H0–5, H1–5, H2–5, H3–5, H4–5, H5–5, H6–5, H7–5, H8–4, lamp 8, R12, —48 volt.
Tens lamp 0 --------- 0 volt, TF–3, lamp 0, R13, —48 volt.
Units lamp 3 -------- 0 volt, U0–5, U1–5, U2–5, U3–4, lamp 3, R14, —48 volt.

After reporting is completed by the controlled station, the controlled station opens its contacts CSE (FIGURE 8) in the circuit of relay DV, and relay DV restores, but relay DR does not reoperate at this time because contacts TF–9 are open. Thereupon continuous "on-line" follow of the telemetered device may ensue, where each incremental change of the input analog signal results in a corresponding change in the digital output signal.

There is a slight possibility of the occurrence of a condition in which the bridge is in balance at a setting of 0090 corresponding to the initial setting of the counting chains as the power is turned on. As a result the null detector circuit does not cause the Barber-Coleman relay contacts to close, and consequently the counting chains do not function. Relay DR will be operated as described, to close its contacts DR–8 (FIGURE 8). The circuit occurs now to effect operation of relays HF and TF so that contacts HF–9 and TF–10 (FIGURE 8) can close to in turn close the output reporting signal circuit loop to the controlled station.

More specifically, slow operate relay B (FIGURE 6) is operated over the path which extends from the zero volt conductor, over contacts L–10, TF–8, R–8, HF–7, and the winding of relay B to negative 48 volt potential.

Relay B operates and at its contacts B–1 (FIGURE 2) operates relay TF over an obvious circuit. Relay TF operates relay HF over the path which extends from the zero volt conductor, over contacts B–1, TF–2, and the winding of relay HF to negative 48 volts. Relay HF operates and at its contacts HF–2 locks itself and relay TF through resistor R10 to the zero volt conductor.

With contacts DR–8, HF–9, and TF–10 (FIGURE 8) closed, the output reporting signal circuit DR is closed. Shortly thereafter, contacts CSE (FIGURE 8) close, operating relay DV, and the controlled station now reads the output from the digital leads.

By way of further example, it is now assumed that the analog input signal corresponds to a digital setting of say, for example, 0490.

Relay DR is operated through contacts DV–2 and TF–9; and is locked over contacts TF–9. As a "raise" is called for by the detector circuit, the hundreds counting chain runs up to H4. When relay R releases after pulsing, the circuit of slow operate relay B (FIGURE 6) is completed through contacts L–10, TF–8, R–8, and HF–7 and after an interval relay B operates, in turn operating relay TF which operates relay HF which closes the output reporting signal circuit DR (FIGURE 8).

As a further example, it is assumed that the analog input signal corresponds to a digital setting of 0480.

As in the prior example, the hundreds chain runs up and over-shoots the mark by advancing to a setting of 0490. Thereupon the detector circuit calls for a "lower" operation and relay HF operates over the path extending from zero volt conductor over contacts L–5, HF–1, and the winding of relay HF to —48 volt, and locks over resistor R10 and HF–2 to the zero volt conductor.

Thereupon the tens chain runs down to T8 at which time the null circuit is in balance. In order to get relay TF operated to complete the output reporting signal circuit DR (FIGURE 8), relay B is pulled over the path which extends from the zero volt conductor, over contacts L–10, TF–8, HF–8, and the winding of relay B to the —48 volt conductor. At its contacts B–1 (FIGURE 2) relay B pulls relay TF.

In all cases, relay DV in its operation at its contacts DV–2, releases relay DR and with relay TF operated and locked, contacts TF–9 (FIGURE 6) are open, and the operation of relay DR is thereafter subject to the control of the deviation chain and deviation set switch in "on-line" follow as will be described hereinafter.

*XVII. Continuous on-line follow*

More specifically, after fast scan and reporting, the converter equipment remains passive and monitors the telemetered device. That is, as soon as the telemetered device causes the slider of potentiometer P1 to move up or down such that the potential of the slider of P1 becomes ¾ of 1 millivolt different than the potential of the base *b1*, the positioner relay is operative to control the driver circuit DCR in the operation of the counting chains to provide a correspondingly new signal output.

For example, let us suppose that the slider of potentiometer P1 moves upward ¾ of 1 ohm so that the slider of potentiometer P1 becomes ¾ of 1 millivolt less negative than the voltage of slider P2 (i.e., slider P1 is at a potential of −4.196¼ volts whereas the slider of P2 has remained at −4.197 volts. At such time base *b2* of transistor TR2 becomes less negative than base *b1*, and collector C2 and base *b3* becomes more negative, whereby the emitter-collector path C3—C3 conducts more current over coil L1 which in turn closes contacts BCR to operate relay R in the drive circuit DRC.

Relay R operates, and at its contacts R–6 (FIGURE 3) operates units chain relay U4 over the path which extends from zero volt conductor over contacts R–6, D–3, U9–12, U0–12, U1–12, U2–12, U3–13, coil of U4, to −48 volt; at its contacts R–1 (FIGURE 1) opens the detector circuit to release the positioner relay BC (which opens its contacts BCR); and at its contacts R–4 (FIGURE 2) operates disconnect relay D.

Relay D operates and at its contacts D–1 (FIGURE 2) opens the circuit of raise relay R; and at its contacts D–4 (FIGURE 3) releases relay U3.

Relay U3 is fast releasing, whereas relay R is slower to release by reason of the circulating current through diode D7 and resistor R8 (FIGURE 2). Thus contacts of relays U4 and U3 in the bridge (FIGURE 1) settle down before raise relay R releases. As units relay operates resistor RU4 (1 ohm) is added to the effective resistance in the bridge circuit reaching a total of 1804 ohms.

When raise relay R releases, contacts R–1 close to reestablish the detector circuit DC. At this time, the detector circuit DC finds that resistor RU4, as a result of the operation of relay U4 and the release of relay U3, has been transferred from the circuit above base *b1* to the circuit below base *b1*, in effect moving the slider of P2 up one ohm, whereby the potential of base *b1* is at −4.196 volt or only ¼ of 1 millivolt less negative than the slider of potentiometer P1. Accordingly, while slightly more current flows through coil L2, it is insufficient to cause contacts BCL to close.

When raise relay R releases it also opens the circuit of relay D which releases and contacts D–1 (FIGURE 2) close to attempt to establish the drive circuit. However, neither raise relay R nor lower relay L operate since both contacts BCR and contacts BCL are open.

If subsequently, the analog quantity to be represented changes and the slider of potentiometer P1 moves to a potential of −4.195 ¼ volt (which is ¾ of 1 millivolt different than the potential of −4.196 volt of the slider of potentiometer P2), contacts BCR will close to operate relay R which will advance the units chain one step (U5 operates and U4 releases).

As units relay U5 operates, resistance RU5 (1 ohm) is transferred from the circuit above base *b1* to the circuit below base *b1*, and its effective resistance of P2 is now 1805 ohms, whereby the potential of base *b1* will become −4.195 volt. As this is only ¼ of 1 millivolt different than the potential −4.195 ¼ of slider P1, no further stepping occurs.

If now an input analog change occurs which causes the slider of P1 to slide downward ½ volt to a potential of −4.195 ¾ volt with the base *b1* still at −4.195 volt, base *b2* of transistor TR2 becomes more negative, and base *b1* becomes more positive, whereby less current flows in coil L1 than L2 to thereon operate contacts BCL and lower relay L.

Lower relay L operates and at contacts L–2 locks, at contacts L–1 opens the detector circuit releasing contacts BCL; at contacts L–4 closes the circuit of slow operate relay D; and at contacts L–8 operates relay U4 in a backward drive of the units chain over the path which extends from the zero conductor over contacts L–8 (FIGURE 3), D–6, U0–10, U9–10, U8–10, U7–10, U6–10, U5–10, coil of relay 4, to −48 volt.

Units relay U4 operates, and at its contacts U4–7 closes a holding circuit for itself to the lower hold circuit which extends from the zero volt conductor over contacts R–7 and D–4 in parallel, D13, R19, U3–9, U4–7, coil of U4, to −48 volt; at its contacts U4–8, prepares a hold circuit for itself to the raise hold circuit; at its contacts U4–9, opens the lower hold circuit of relay U5; at its contacts U4–11 prepares an operating circuit to units relay U3; and at its contacts U4–13 prepares an operating circuit to units relay U5.

Disconnect relay D operates, and at its contacts D–1 (FIGURE 2) opens the circuit of lower relay L which releases after an interval; and at its contacts D–5 releases units relay U5 which has been holding to the raise hold circuit. Units relay U5 at its contacts U5–1 removes resistance RU5 from the effective resistance of P2 which is now 1804 ohms.

Lower relay L releases, and at its contacts L–1 (FIGURE 1) reestablishes the detector circuit; and at its contacts L–4 (FIGURE 2) releases disconnect relay D. The closure of break contacts L7 and D–5 (FIGURE 3) recloses the raise hold circuit.

When the detector circuit is reestablished by relay L, it finds the bridge circuit with resistor RU5 transferred from the circuit below base *b1* to the circuit above *b1*, whereby the potential of base *b1* is at −4.196 volts which is ¼ volt more negative than the potential of −4.195 ¾ of the slider of P1. Accordingly neither coils L1 or L2 operate contacts BCR nor BCL.

The detector circuit DC, drive circuit DCR and relay counting chains of the analog to digital converter are thus operative to follow the changing input analog signal at slider P1, and to provide output signals in the digital code of corresponding different values.

SPECIFIC STEPPING OPERATION OF CHAINS THCC, HCC, TCC AND UCC

In following the movements of the slider of P1 in the continuous on-line manner set forth above, the counting chains advance from units to tens to hundreds to thousands in both the advance and decline of the analog input values. The different conditions of operation, and the manner in which the chains operate in a ring fashion are more fully described hereinafter.

By way of initial example, it is assumed that the slider P1 is operated to its lowermost position (i.e., −6 volt) and that the slider of P2 (i.e. base *b1*) is operated to its lowermost position (i.e., −6 volt) as the result of follow of the on-line analog input, and that the counting chain relays TH0, H0, T0, and U0 are operated and locked in such position.

Referring to FIGURE 1 it can be seen that with contacts TH0–5, H0–5, T0–5, and U0–5 open, no path exists for reoperating relay L, and the chains cannot be driven backward any further from their lowermost position.

It is next assumed that the slider of P1 gradually moved from the lowermost position to the uppermost position, and that in response to the resultant pulsing of drive circuit relays R and D, the counting chains are driven to increase the digital signal output.

It is first recalled that the stepping of driver circuit DRC consists of relay R operating relay D which releases relay R which releases relay D which operates relay R, etc.; or relay L operating D which releases relay L which releases relay D which operates relay L, etc. Now, referring to the raise drive circuit of FIGURE 3, on a raise operation, relay R operates to close contacts R–6 which energizes the raise drive circuit. Subsequently relay D opens contacts D–3 to thus open the raise drive circuit. As relay R subsequently opens contacts R–6 the raise drive circuit is held open. As relay D closes contacts D–3 thereafter, contacts R–6 keep the raise drive circuit open. Thus on each cycle of operation of relays R and D in the drive circuit DRC, a pulse is sent to the counting chain.

Referring to the raise hold circuit of FIGURE 3, during raise operations, contacts D–5 open and close during each cycle of operation of relays R and D, but contacts L–7 remain closed, to maintain the raise drive circuit closed. However, during raise operations, the lower hold circuit is opened during the interval of each cycle that relays R and D are both energized.

Thus during a cycle of operation of relays R and D:

(a) Raise relay R at its contacts R–6 (FIGURE 3) effects the operation of the next higher relay in the chain sequence.

(b) The next higher relay closes holding circuits for itself to the raise hold circuit.

(c) The next higher relay opens the circuit from the relay immediately below it to the raise hold circuit in preparation for its release.

(d) Disconnect relay D at its contacts D–4 (FIGURE 3) effects the release of the relay immediately below by opening the lower hold circuit.

(e) When relay R releases, the lower hold circuit is reclosed, and the next higher relay is also holding to the lower hold circuit.

(f) When relay D releases, parallel circuits in both hold circuits are reclosed.

During a cycle of operation of relays L and D:

(a) Relay L at its contacts L–8 (FIGURE 3) effects the operation of the next lower relay.

(b) The next lower relay closes holding circuit for itself to the lower hold circuit.

(c) The next lower relay opens the circuit from the relay immediately above it to the lower hold circuit in preparation for its release.

(d) Relay D at its contacts D–5 (FIGURE 3) effects the release of the relay immediately below by opening the raise hold circuit.

(e) When relay L releases the raise hold circuit is reclosed, and the next lower relay also holds to the raise hold circuit.

(f) When relay D releases, the parallel circuits in both the raise and lower hold circuits are reclosed.

The following drive circuit relay sequence occurs in stepping the potentiometer P2 from its lowermost position to its uppermost position.

1st pulse ---------------
R up—U1 up.
D up—U0 down.
R down.
D down.

2nd pulse ---------------
R up—U2 up.
D up—U1 down.
R down.
D down.

3rd pulse ---------------
R up—U3 up.
D up—U2 down.
R down.
D down.

.
.

9th pulse ---------------
R up—U9 up.
D up—U8 down.
R down.
D down.

10th pulse ---------------
R up—U0 up, T1 up.
D up—U9 down, T0 down.
R down.
D down.

During the 10th pulse, the units chain starts over again with relay U0 operating over the path which extends from the zero volt conductor over contacts R–6, D–3, HF–4, U9–13, U8–12, rectifier D19 and the coil of relay U0, to −48 volt. Tens relay T1 operates over the path which extend from zero volt conductor over contacts R–6, D–3, HF–4, U9–13, U8–12, rectifier D–22, C20 (FIGURE 3 to FIGURE 4), contacts T9–12, T0–13, coil of T1, to −48 volt. Units relay U9 releases because contacts D–4 open the holding circuit which extended from the zero volt conductor over contacts D–4, D13, R19, U9–7, U8–9, coil of U9, to −48 volt, contacts U0–6 of relay U0 having previously opened its path to the raise hold circuit. Tens relay T0 releases because contacts D–4 opens its holding circuit which extended from the zero volt and over contacts D–4, D12, R18, C13 (FIGURE 3 to FIGURE 4), T9–9, T0–7 and the coil of relay T0, to −48 volts, the contacts T1–6 having previously opened the path which extended to the raise hold circuit from the zero volt conductor over contacts L–7, D–17, R23, C17 (FIGURE 3 to FIGURE 4), T0–8, T1–6, coil of T0, to −48 volt.

Thus the units chain goes round and round in a "ring" or circle as each group of ten successive forward stepping pulses are received.

As the units chain advances to relay U9 as described, relays R and D operate in the subsequent pulse to provide a pulse as described to the tens counting chain of FIGURE 4.

With U9 up at the end of each round of the units chain, pulses are coupled to the tens chain to effect the following operations:

1st pulse ---------------
R up—T1 up.
D up—U0 down.
R down.
D down.

2nd pulse ---------------
R up—T2 up.
D up—T1 down.
R down.
D down.

3rd pulse ---------------
R up—T3 up.
D up—T2 down.
R down.
D down.

.
.

9th pulse ---------------
R up—T9 up.
D up—T8 down.
R down.
D down.

10th pulse ---------------
R up—T0 up, H1 up.
D up—T9 down, H0 down.
R down.
D down.

During the receipt of the tenth pulse by the tens chain, the tens chain TCC starts over again with tens relay T0 operating over the path which extends from the zero volt conductor over contacts R–6, D–3, U9–13, U8–12, D22, C20 (FIGURE 3 to FIGURE 4), T9–13, T8–12, D23, coil of T0, to −48 volt. Hundreds relay H1 operates over the path which extends from the zero volt conductor over contacts R–6, D–3, U9–13, U8–12, D22, C20 (FIGURE 3 to FIGURE 4), T9–13, T8–12, D–26, HF–5, C22 (FIGURE 4 to FIGURE 5), H9–12, H0–13, coil of H1, to −48 volt. Relay D at its contacts D–4 opens the holding circuit for tens relay T9 which extends from the zero volt conductor over contacts D–4, R12, R18, C13 (FIGURE 3 to FIGURE 4), T9–7, T8–9, the coil of relay T9, to −48 volt, relay T0 at its contacts T0–6 having previously opened its path to the raise hold circuit. Hundreds relay H0 releases in that relay D at its contacts D–4 opens the holding circuit for relay H0 which extended from the zero volt conductor over contacts D–4, D11, R17, C12 (FIGURE 3 to FIGURE 5), H9–9, H0–7, coil of H0, to −48 volt, relay H1 at its contacts H1–6 having previously opened its path to the raise hold circuit.

Thus the tens chain goes round and round as successive sets of ten pulses are coupled thereto.

With relay T9 up as described during a cycle of the chain, the next stepping of relays R and D provides a pulse, as described, to the hundreds counting chain of FIGURE 5, and the hundreds chain operates as follows in response thereto:

| | |
|---|---|
| 1st pulse | R up—H1 up.<br>D up—H0 down.<br>R down.<br>D down. |
| 2nd pulse | R up—H2 up.<br>D up—H1 down.<br>R down.<br>D down. |
| 3rd pulse | R up—H3 up.<br>D up—H2 down.<br>R down.<br>D down. |
| . | |
| 9th pulse | R up—H9 up.<br>D up—H8 down.<br>R down.<br>D down. |
| . | |
| 10th pulse | R up—H0 up, TH1 up.<br>D up—H9 down, TH0 down.<br>R down.<br>D down. |

As the tenth pulse is coupled to the hundreds chain, the hundreds chain starts over again with relay H0. That is, hundreds relay H0 operates over the path which extends from the zero volt conductor, over contacts R–6, D–3, U9–13, U8–12, D22, C20 (FIGURE 3 to FIGURE 4), T9–13, T8–12, D26, HF–5, C22 (FIGURE 4 to FIGURE 5), H9–13, H8–12, D27, coil of H0, to −48 volt. Relay TH1 operates over this same path, the circuit extending over contacts H8–12, C24 (FIGURE 5 to FIGURE 6), TH0–6, the coil of relay TH1, to −48 volt.

Hundreds relay H9 releases because contacts D–4 open the holding circuit therefor which extends from the zero volt conductor over contacts D–4, D11, R17, C12 (FIGURE 3 to FIGURE 5), H9–7, H8–9, coil of relay H9 to −48 volt, hundreds relay H0–8 at its contacts H0–6 having previously opened the path from relay H9 to the raise hold circuit over conductor C16. Relay TH0 releases because relay D at its contacts D–4 opens the holding circuit which extends from the zero volt conductor, over contacts D–4, D10, R16, C11 (FIGURE 3 to FIGURE 6), TH0–7, the coil of TH0, to −48 volt, contacts TH1—7 having previously opened the holding path of relay TH0 which extends via C15 to the raise hold circuit.

As the counting progresses to the point at which relays TH1, H9, T9, and U9 are operated, and with the operation of relay R and relay U9, contacts TH1–12, H9–16, T9–16, and U9–16 are all open. Relay R releases later during the cycling of relays R and D, and opens its holding contacts R–2 and R–3 to reestablish the detector circuit. If the bridge is still unbalanced and calls for a raise, coil L1 operates contacts BCR. The subsequent release of relay D effects closure of its contacts D–1 to attempt to further operate the drive circuit. Even though contacts BCR are closed, the circuit from the zero volt conductor to the coil of relay R is open so that relay R cannot reoperate. Such reoperation must be prevented to keep the counting chains from taking a 0000 position which would keep the system recycling.

In more detail, if the slider of P1 advances upward so that 1999 ohms resistance obtains between the −6 volt conductor and the slider of P1, the slider of P2 is advanced so that a circuit can be traced from the −6 volt conductor through resistors TH1, RH1, RH9, RT1–RT9, and RU1–RT9, whereby 1999 ohms obtains between the −6 volt conductor and base *b1* of transistor T1. At this point relay R is prevented from further pulsing as described above.

If now the slider of P1 moves upward 1 ohm, the bridge becomes unbalanced, and contacts BCR close, but relay R does not operate. If the slider of P1 then moves downward one ohm, the bridge becomes balanced.

If the slider then moves downward at least ¾ of 1 ohm, the bridge becomes unbalanced in the opposite direction, and contacts BCL close.

Contacts BCL operate lower relay L over the path from zero volt through contacts TH0–5, H0–5, T0–5, and U0–5 in parallel, conductor C1, coil of L, contacts BCL, D–1, to −48 volt. Recalling that relays TH1, H9, T9 and U9 are in the operated position, the operation of relay L closes a circuit to operate units relay U8 over the path which extends from the zero volt conductor (FIGURE 3) over contacts L–8, D–6, TF–4, U0–10, U9–11, coil of U8, to −48 volt.

Units relay U8 operates and at its contacts U8–7 locks to the lower hold circuit over the path which extends from the zero volt conductor over contacts R–7 and D–4 in parallel, D13, R19, U7–9, U8–7, coil of U8, to −48 volt; at its contacts U8–8 prepares a locking circuit to the raise hold circuit which contacts U9–6 presently holds open; at contacts U8–9 opens the holding circuit of relay U9 to the lower hold circuit, units relay U9 holding to the raise hold circuit until relay D operates; at its contacts U8–11 prepares an operating circuit to units relay U7 effective if another lower pulse occurs; and at its contacts U8–13 prepares an operating circuit to units relay U9.

The following sequence chart indicates the units chain operative in response to movement downward of the slider of P1 and the pulsing of the chain by relay L in the drive circuit DRC.

| | |
|---|---|
| 1st pulse | L operates—U8 operates.<br>D operates—U9 releases.<br>L releases.<br>D releases. |
| 2nd pulse | L operates—U7 operates.<br>D operates—U8 releases.<br>L releases.<br>D releases. |
| . | |
| . | |
| . | |
| 9th pulse | L operates—U0 operates.<br>D operates—U1 releases.<br>L releases.<br>D releases. |
| 10th pulse | L operates—U9 operates, T8 operates.<br>D operates—U0 releases, T9 releases.<br>L releases.<br>D releases. |

As the tenth pulse is received, the units chain UCC starts over again at the upper end of the chain. That is, units relay U9 operates over the path which extends from the zero volt conductor over contacts L–8, D–6, TF–4, U0–11, U1–10, D–21, coil of U9, to −48 volt. Simultaneously a tens count is removed by lowering the tens chain one step to the next lower tens group (i.e., as the count is being changed from 1990 to 1989, the tens chain must drop to the eighty count relay). Thus tens relay T8 operates over the path which extends from the zero volt conductor over contacts L–8, D–6, TF–4, U0–11, U1–10, TF–6, D20, C19 (FIGURE 3 to FIGURE 4) T0–10, T9–11, Coil of T8, to −48 volt. Units relay U0 releases because contacts D5 opens the holding circuit therefor which extends over the path from the zero volt conductor over contacts D–5, D18, R24, U0–8, U1–6, coil of U0, to −48 volt, contacts U9–9 having previously opened is holding circuit to the lower hold circuit. Tens relay T9 releases because contacts D5 open its holding circuit over the path which extends from the zero volt conductor over contacts D–5, D17, R23, C17 (FIGURE 3 to FIGURE 4), T0–6, T9–8, contacts T8–9 having previously opened its holding circuit to the lower hold circuit.

Thus the units chain goes round and round in reverse direction as successive reverse stepping occurs, and as each new reverse cycle occurs a pulse is provided to lower the tens counting chain TCC.

The following sequence refers to lower pulses incoming to the tens chain at the start of each reverse cycle of the units chain UCC (units relay U0 operated):

| | |
|---|---|
| 1st pulse | L operates—T8 operates.<br>D operates—T9 releases.<br>L releases.<br>D releases. |
| 2nd pulse | L operates—T7 operates.<br>D operates—T8 releases.<br>L releases.<br>D releases. |
| . . . | |
| 9th pulse | L operates—T0 operates.<br>D operates—T1 releases.<br>L releases.<br>D releases. |
| 10th pulse | L operates—T9 operates, H8 operates.<br>D operates—T0 releases, H9 releases.<br>L releases.<br>D releases. |

During the tenth pulse, the tens chain starts over again at the upper end of the chain with tens relay T9 operating over the path which extends from the zero volt conductor over contacts L–8, D–6, TF–4, U0–11, U1–10, TF–6, D20, C19 (FIGURE 3 to FIGURE 4), T0–11, T1–10, D25, coil of T9, to −48 volt. Since the count is now being lowered into the next lower hundred group (i.e. from 1900 to 1899) the hundred relays chain must also be dropped by one count, the hundreds chain advancing circuit extending from the zero volt conductor over contacts L–8, D–6, TF–4, U0–11, U1–10, TF–6, D20, C19, T0–11, T1–10, D24, TF–7, C21 (FIGURE 4 to FIGURE 5), H0–10, H9–11, and the coil of H8 to −48 volt operates relay H8.

Tens relay T0 releases in that contacts D–5, open its holding circuit which extends from the zero volt conductor over contacts D–5, D17, R23, C17 (FIGURE 3 to FIGURE 4), T0–8, T1–6, coil of T0 to −48 volt, tens relay T9 at is contacts T9–9 having previously opened the holding circuit for relay T0 to the lower hold circuit. Relay H9 releases because contacts D–5 open its holding circuit which extends from the zero volt conductor over contacts D–5, D16, R22, C16 (FIGURE 3 to FIGURE 5), H0–6, H9–8, the coil of H9, to −48 volt, hundreds relay H8 at its contacts H8–9 having previously opened its holding path to the lower hold circuit.

Thus the tens chain goes round and round in reverse direction as successive reverse stepping pulses are received, the tens relay being operative at the initiation of each reverse cycle (tens relay T0 operated) to lower the hundreds counting chain HCC one step.

The following sequence chart sets forth the operation of the hundreds chain as each reverse cycle of the tens chain occurs.

| | |
|---|---|
| 1st pulse | L operates—H8 operates.<br>D operates—H9 releases.<br>L releases.<br>D releases. |
| 2nd pulse | L operates—H7 operates.<br>D operates—H8 releases.<br>L releases.<br>D releases. |
| . . . | |
| 9th pulse | L operates—H0 operates.<br>D operates—H1 releases.<br>L releases.<br>D releases. |
| 10th pulse | L operates—H9 operates, TH0 operates.<br>D operates—H0 releases, TH1 releases.<br>L releases.<br>D releases. |

During the receipt of the tenth pulse, the hundreds chain starts over again at the upper end with relay H9 operating over the path which extends from the zero volt conductor over contacts L–8, D–6, TF–4, U0–11, U1–10, TF–6, D20, C19 (FIGURE 3 to FIGURE 4), T0–11, T1–10, D24, TF–7, C21 (FIGURE 4 to FIGURE 5), H0–11, H1–10, D28, coil of H9, to −48 volt. Assuming the count is being reduced from 1000 to 999 the thousands counting chain must now be reversed by one step, and accordingly relay TH1 is released and relay TH0 is operated. Thousands relay TH0 operates and a circuit which extends from the zero volt conductor over contacts L–8, D–6, TF–4, D0–11, U1–10, TF–6, D20, C19, T0–11, T1–10, D24, TF–7, C21, H0–11, H1–10, conductor C23 (FIGURE 5 to FIGURE 6), TH1–6, the coil of relay TH0, to −48 volt. Relay H0 releases in that contacts D–5 open the holding circuit which extends from the zero volt conductor over contacts D–5, D16, R22, C16 (FIGURE 3 to FIGURE 5), H0–8, H1–6, coil of H0, to −48 volt, hundreds relay H9 at its contact H9–9 having previously opened the holding path which extended to the lower hold circuit. Relay TH1 releases in that contacts D–5 opens it holding circuit which extends from the zero volt conductor over contacts D–5, D15, R21, C15 (FIGURE 3 to FIGURE 6), TH1–9, coil of TH1 to −48 volt, relay TH0 at its contacts TH0–9 having previously opened its holding path to the lower hold circuit.

Thus as the hundreds chain completes its first reverse cycle, relay TH0 operates and relay TH1 releases. As succeeding pulses are coupled to the hundreds chain, the chain steps from H8 to H7, etc., down to H0. Succeeding pulses to the tens chain, step the tens chain down to relay T0. Succeeding pulses to the units chain step the units chain down to relay U0. At this point contacts TH0–5, H0–5, T0–5, and U0–5 (FIGURE 2) are all open to guard against any further pulsing of relay L.

*I. Reporting responsive to occurrence of a predetermined deviation*

The operation of the counting chains proceeds without interruption to provide a changing digital output with changes in the analog input in the manner described in the previous section if the deviation set switch of FIGURE 6 is manually placed in the "OFF" position.

However, alternative positions 1–10 on the deviation set switch are manually selectable so that reporting from the controlled station to the control station will automatically be provided in response to the occurrence of a deviation of a predetermined number of steps from a previous readout by the system.

(*a*) DETECTING DEVIATION IN A RAISE DIRECTION

It is assumed, for exemplary purposes, that the slider of P1 is set at 1803 as before; that the bridge is in balance; and that the deviation set switch has been manually set to position 10.

Preparation relay A (FIGURE 7) will have been operated over the circuit which extends from the zero volt conductor over contacts R26, B1–2, B2–2, B3–2, B4–2, B5–2, A–3, the coil of A to —48 volt; and will be locked over the circuit extending from the zero volt conductor (FIGURE 3) over contacts D9, R15, C10 (FIGURE 3 to FIGURE 7), AL–4, A–4, coil of A, to —48 volt.

Assuming now that the slider of P1 is adjusted upwardly to in turn cause the converter to adjust the slider of P2 upwardly from a reading of 1803 to a reading of 1813, Such operation entails ten cycles of relays R and D in the drive circuit DRC, as before described, which results in the transmission of ten raise pulses to the counting chains, and also to the deviation counting chain DCC of FIGURE 7. The manner of operation of the deviation circuit in response to the receipt of such pulses is now described in detail.

(1) *First raise pulse.*—In more detail, as relay R operates to generate the first deviation pulse, it is effective at its contacts R–6 (FIGURE 3) to operate relay B1 in the deviation counting chain DCC, the circuit extending from the zero volt conductor over contacts R–6, D–3, C8 (FIGURE 3 to FIGURE 7), AL–2, DR–4, B–5, A–7, coil of B1, DV–3, to —48 volt; and at its contacts R–4 (FIGURE 2) it operates relay D.

Deviation counting chain relay B1 operates and at its contacts B1–8 locks to the raise hold circuit which extends from the zero volt conductor (FIGURE 3) over contacts L–7 and D–5 in parallel, D14, R20, C14 (FIGURE 3 to FIGURE 7), AL–6, DR–6, B1–8, B2–6, coil of B1 and DV–3, to —48 volt; at its contacts B1–7 locks to the lower hold circuit, the circuit extending from the zero volt conductor (FIGURE 3) over contacts R–7 and D–4 in parallel, D9, R15, C10 (FIGURE 3 to FIGURE 7), AL–4, DR–5, B5–3, B1–7, A–5, coil of B1, DV–3, to —48 volt; at its contacts B1–13 prepares a circuit to relay B2; at its contacts B1–2 opens the original operating circuit of relay A; at its contacts B1–10 and B1–11 prepares circuits to drive the chain backward; at its contacts B1–12 cuts off the relays beyond B2 from the forward drive circuit; at its contacts B1–6 opens a point in a hold circuit of relay B5; at its contacts B1–3 prepares another holding circuit for itself; at its contacts B1–9 opens a point in one of the holding circuits of relay B2; at its contacts B1–1 (FIGURE 6) prepares a circuit for deviation reached relay DR; and at its contacts B1–4 (FIGURE 6) prepares a holding circuit for relay AL.

Disconnect relay D (FIGURE 2) in the drive circuit operates on the first pulse, and at its contacts D–4 (FIGURE 3) opens the lower hold circuit for relay A which releases in that contacts R–7 (FIGURE 3) are open at this time; and at its contacts D–1 (FIGURE 2) opens the circuit of relay R.

Relay A releases, and closes its contacts A–3. However, contacts B1–2 are open, and relay A does not reoperate. As will be apparent from the circuit and following description, as long as any of the relays B1–B5 are operated, relay A cannot reoperate.

In the drive circuit, relay R releases, in turn releasing relay D which recloses the circuit of relay R to provide the second pulse.

(2) *Second raise pulse.*—When relay R operates on the second pulse, it is effective at its contacts R–6 to operate relay B2 over the circuit extending from the zero volt conductor over contacts R–6, D–3, C8, AL–2, DR4, B5–12, B1–13, coil of B2, to —48 volt.

Relay B2 operates, and at its contacts B2–8 locks to the raise hold circuit, the locking circuit extending over contacts AL–6 (FIGURE 7), DR–6, B2–8, and B3–6; and at its contacts B2–13 prepares a circuit to relay B3.

When relay D operates, contacts D–4 (FIGURE 3) release relay B1, contacts B2–6 having previously opened the holding circuit of relay B1 to the raise hold circuit.

In the drive circuit, relay R releases, in turn releasing relay D which recloses the circuit of relay R to provide the third pulse.

(3) *Third raise pulse.*—As relay R operates to provide the third pulse, it is effective at contacts R6 to operate relay B3, the circuit extending from the zero volt conductor (FIGURE 3) over contacts R–6, D–3, C8, AL–2, DR–4, B5–12, A–8, B1–12, B2–13, coil of B3, DV–3, to —48 volt. Relay B3 operates and at its contacts B3–8 (in the manner of relay B2) locks to the raise hold circuit. Relay D at its contacts D–4 (FIGURE 3) releases relay B2.

Relay R releases, in turn releasing relay D which recloses the circuit of relay R to provide the fourth pulse.

(4) *Fourth raise pulse.*—As relay R operates to provide the fourth pulse, it is effective at its contacts R6 to operate relay B4, the circuit extending from the zero volt conductor over contacts R6, D–3, C8, AL–2, DR–4, B5–12, A–8, B1–12, B2–12, B3–13, coil of B4, DV–3, to —48 volt. Relay B4 operates, and at its contacts B4–8 locks to the raise hold circuit in the manner of relays B2–B3.

Relay D operates and at its contacts D–4 releases relay B3. Relay R releases, in turn releasing relay D which recloses the circuit of relay R to provide the fifth pulse.

(5) *Fifth raise pulse.*—As relay R operates to provide the fifth pulse it is effective at its contacts R6 to operate relay B5, the circuit extending from the zero volt conductor over contacts R6, D–3, C8, AL–2, DR–4, B5–12, A–8, B1–12, B2–12, B3–12, B4–13, coil of B5, DV–3, to —48 volt. Relay B5 operates, and at its contacts B5–8 locks to the raise hold circuit in the manner of relays B1–B4, and at its contacts B5–13 prepares a circuit to operate relays B1 and C and the next pulse is coupled to the deviation counting chain.

Relay R releases, in turn releasing relay D which recloses the circuit of relay R to provide the sixth pulse.

(6) *Sixth raise pulse.*—As relay R operates to provide the sixth pulse, it is effective at its contacts R–6 to operate relay B1, the circuit extending from the zero volt conductor (FIGURE 3), over contacts R–6, D–3, C8, AL–2, DR–4, B5–13, B4–12, D29, B1, DV–3, to —48 volt. The operating circuit also extends from contacts B4–12 over contacts C–8 and the coil of C to —48 volt.

Relay C operates and at its contacts C–7 locks to the raise hold circuit, the circuit extending over contacts D30, DR–6, AL–6, and at contacts C–7 also prepares a path to the lower hold circuit over D31, B5–3, DR–5, AL–4; at its contacts C–8 opens its original operating circuit; at its contacts C–6 opens a point in the reverse drive circuit of relay A; and at its contacts C–1 to C–5 (FIGURE 6) prepares circuits from relay DR to points 6 to 10 on the deviation set switch.

Relay D operates, and at its contacts D–4 releases relay B5. Relay R releases, in turn releasing relay D which recloses the circuit of relay R to provide the seventh pulse.

(7) *Seventh–Ninth raise pulse.*—The counting chain operates in the manner described above as successive pulses are received, and only a brief outline thereof is required. Thus, as the relay R provides the seventh pulse, relay B2 operates over the path traced above, and relay D operates to release relay B1. As relay R operates to provide the eighth pulse, relay B3 operates and locks, and relay D operates to release relay B2. As relay R operates to provide the ninth pulse, relay B4 operates and locks, and relay D is operated to release relay B3.

(8) *Tenth raise pulse.*—It will be recalled that the deviation set switch DSS has been normally set to the tenth position, and accordingly automatic reporting occurs as the deviation steps are detected.

Thus as relay R operates to provide the tenth pulse, relay B5 operates and at its contacts B5–1 operates deviation readout relay DR, the circuit extending from the zero volt conductor B5–1, coil of deviation readout relay DR, to −48 volt.

Deviation readout relay DR operates, and at its contacts DR–1 (FIGURE 6) locks over the circuit extending from zero volt conductor over contacts DV–2, DR–1, and the coil of DR, to −48 volt; at its contacts DR–2, opens a point in the operating circuit of alternate deviation relay AL; at its contacts DR–3 prepares a holding circuit for preparation relay A; at its contacts DR–4, DR–5, DR–6, and DR–7 opens the drive and hold circuits to the deviation counting chain to thereby release relays B4, B5 and C; and at its contacts DR–8 (FIGURE 8) extends an output call signal to the controlled station.

The release of relays B4 and B5, recloses the operating circuit of relay A which reoperates, and holds over contacts DR–3; and over A–4 and AL–2 to the lower hold circuit. Such circuit is provided over contacts DR–3 to prevent the release of relay A in the event pulsing occurs in the interval of time between the transmission of call signal DR and the receipt of the ready back signal DV.

When the controlled office is ready to send, it closes contacts shown in FIGURE 8 to operate deviation ready relay DV.

Deviation ready relay DV operates, and at its contacts DV–1 (FIGURE 1) opens the energizing circuit for the detector circuit DC to prevent operation thereof and stepping of the counting chains during the sending of the digital signals by the controlled office to the control office; at its contacts DV–2 (FIGURE 6) releases deviation reached relay DR; and at its contacts DV–3 (FIGURE 7) opens the drive circuit to relays B1–B5 of the deviation chain.

Deviation reached relay DR restores and at contacts DR–1 opens its own holding circuit; opens its contacts DR–2 in the circuit of relay AL; opens its contacts DR–3 in the circuit of relay A which remains operated; closes contacts DR–4 to DR–7 to reconnect the drive and hold circuits to the deviation counting chain; and opens contacts DR–8 to terminate the output call signal.

Thereupon, the controlled office transmits signals to the control office as determined by the decimal outputs (FIGURE 8) on the digital output conductor to the two-out-of-five registers in the telemetering transmitter, which in turn transmits the information to the receiver at the control station to update the reading in the in-line display at the control office. In the present example, the digital reading on the output conductors is 1813 when the report is automatically made by the equipment.

It is once more noted that the in-line display at the controlled (pumping) station is continuously up dated by the counting chains in their "follow" of the analog input to the converter.

When the controlled station has completed the transmission of the information to the control station, contacts CSE in the circuit of relay DV are opened to release relay DV. Relay DV restores and at its contacts DV–1 (FIGURE 1) reestablishes the detector circuit; at its contacts DV–2 (FIGURE 6) prepares the circuit of deviation reached relay DR; and at its contacts DV–3 (FIGURE 7) recloses −48 volt to relays B1–B5 in the deviation counting chain.

At this time, the analog to digital converter is reset to operate, the setting on potentiometer P2 being 1813 (i.e., relays TH1, H8, T1, and U3 in the operated condition). During the short interval between the opening and closing of contacts DV–1 (FIGURE 1) it is possible that the slider of P1 may have moved. However, when contacts DV–1 reclose, stepping automatically occurs until the counting chains have once more balanced the bridge. As contacts DV–3 close, the deviation counting chain is conditioned for stepping, and the stepping of the chains to balance the bridge is counted by the deviation counting chain.

(b) DETECTING DEVIATIONS IN LOWER DIRECTION

In the foregoing example, the deviation chain was operative to count the deviations which occur as the result of the receipt of raise pulses. According to the invention, the same chain is also utilized to count the deviations which occur in a lower direction.

By way of example, it is now assumed that the slider of P1 is set at 1813; that the bridge is in balance; that the deviation set switch is still set at position 10, and that relay A is operated. It is further assumed that the slider of P1 is moved down normally, and the converter adjusts the slider of P2 from the reading of 1813 to a reading of 1803 by effecting ten cycles of drive circuit relays R and D as before described. During such operation ten lower pulses are transmitted to the numerical counting chains, and also to the deviation counting chain which will count the lower pulses by responding in the order B1–B2, etc. The deviation chain is adjusted to drive forward to record these lower pulses during the first lower pulse received by the operation of relay AL.

(1) *First lower pulse*.—More specifically, lower relay L operates to provide the first lower pulse, and at its contacts L–8 (FIGURE 3) operates chain relay B1 over the circuit which extends from zero volt conductor over contacts L–8, D–6, C18 (FIGURE 3 to FIGURE 7), AL–8, DR–7, B1–10, B5–10, B4–10, B3–10, B2–10, C–6, A–6, rectifier, coil of B1, DV–3, to −48 volt; at its contacts L–9 (FIGURE 6) operates alternate deviation relay AL over the circuit which extends from zero volt conductor over contacts DV–2, DR–2, L–9, A–1, D–7, coil of AL, to −48 volt; and at its contacts L–4 (FIGURE 2) energizes disconnect relay D.

Relay B1 operates and at its contacts B1–8 locks to the raise hold circuit over the circuit including contacts AL–6, DR–6, B1–8, and B2–6; and locks to the lower hold circuit over contacts AL–4, DR–5, B5–3, B1–7, and A–5.

Relay AL operates shortly thereafter, and at its contacts AL–1 (FIGURE 6) locks over the circuit which extends from the zero volt conductor over contacts DV–2, DR–2, R25, B1–4, AL–1, coil of AL, to −48 volt; at its contacts AL–2 and AL–3 transfers the forward drive path of the deviation chain from the raise drive circuit to the lower drive circuit; at its contacts AL–8 and AL–9 transfers the reverse drive circuit of the deviation chain from the lower drive circuit to the raise drive circuit; at its contacts AL–6 and AL–7 transfers the forward hold circuit from the raise hold circuit to the lower hold circuit; and at its contacts AL–4 and AL–5 transfers the reverse hold circuit from the lower hold circuit to the raise hold circuit. Both the forward and reverse hold circuits are energized at the time of this transfer and the transfer contacts of AL are of the make-before-break type so that relay B1 is held operated as well as relay A.

Slow to operate disconnect relay D (FIGURE 2) operates, and at its contacts D–5 (FIGURE 3) releases relay A (FIGURE 7); and at its contacts D–1 (FIGURE 2) deenergizes relay L which releases a short interval thereafter as determined by the circulating current through diode D8 and resistor R9. When relay A releases, contacts A–2 (FIGURE 6) parallel contacts B1–4 in the holding circuit of relay AL. In the drive circuit, lower relay L releases and in turn releases relay D which recloses the circuit of relay L to provide the second pulse to the deviation counting chain.

(2) *Second lower pulse*.—In providing the second pulse, relay L at its contacts L–8 (FIGURE 3) operates relay B2 (FIGURE 7) over the circuit which extends from the zero volt conductor over contacts L–8, D–6, C18, AL–3, DR–4, B5–12, A–8, B1–13, coil of B2, DV–3, to −48 volt; and at its contacts L–4 (FIGURE 2) energizes relay D.

Relay B2 operates, and at contacts B7–8 locks to the lower hold circuit over a circuit extending from zero volt conductor (FIGURE 3), over contacts R–7 and D–4 in parallel, D9, R15, C10, AL–7, DR–6, the forward hold lead, B2–8, B3–6, the coil of B2, DV–3, to —48 volt; and locks to the raise hold circuit over the circuit extending from the zero volt conductor (FIGURE 3) over contacts D–5, D14, R–20, C14, AL–5, DR–5, reverse hold lead, B5–3, B1–7, A–5, coil of B1, DV–3, to —48 volt.

Relay D operates and at its contacts D–5 (FIGURE 3) releases relay B1; and releases relay L. Relay B1 releases and opens contacts B1–4 (FIGURE 6) but contacts A–2 are closed to hold relay AL operated.

In the drive circuit, lower relay L releases relay D which recloses the circuit of relay L to provide the third pulse.

(3) *Third through tenth lower pulses.*—In similar fashion, contacts L–8 (FIGURE 3) drive the relays of the deviation counting chain DCC forward in the sequence previously described, the chain recycling and relay C operating on the sixth pulse as before. On the tenth pulse, relay DR (FIGURE 6) operates in the manner previously described, and in addition to performing the functions described before (including the release of the deviation counting chain) relay DR is also effective at its contacts DR–2 (FIGURE 6) to restore relay AL.

Relay DR operates as before to transmit the call signal to the controlled office, and the controlled office sends a ready back signal to operate relay DV. Upon the release of relay DV by the controlled station, the system is ready to effect further conversion and deviation detection.

(c) SYSTEM OPERATION IN RESPONSE TO RECEIPT OF RAISE PULSES OF A TOTAL NUMBER LESS IN NUMBER THAN SET DEVIATION FOLLOWED BY LOWER PULSES OF A TOTAL NUMBER LESS IN NUMBER THAN SET DEVIATION

It is now assumed that the deviation counting chain is reset; that the deviation set switch is set at 10; that slider P1 is adjusted upwardly and seven raise pulses are received over break contacts of relay AL driving the deviation chain forward until relay B2 becomes operated on the second round. Relay A was released on the first pulse, relay C was operated and locked on the sixth pulse, relay AL is restored, and it is assumed that the slider of P1 is now adjusted downwardly and seven lower pulses are transmitted to the deviation chain. Thus a total of fourteen pulses are transmitted to the chain, but the setting of the system after the adjustment must be the same as before the adjustment occurred. The manner in which the chain is operative to effect accurate and reliable recording of such changes is now set forth.

(1) *First lower pulse.*—Lower relay L operates and at its contacts L–8 (FIGURE 3) operates deviation chain relay B1 over the circuit extending from zero volt conductor over contacts L–8, D–6, C18, AL–8, DR–7, B1–10, B5–10, B4–10, B3–10, B2–11, coil of B1, DV–3, to —48 volt; and at its contacts L–4 closes the circuit of relay D.

Relay B1 operates and at reset contacts B1–8 locks to the raise hold conductor, the circuit extending over contacts B2–6, B1–8, DR–6, and AL–6; and locks to the lower hold conductor over contacts A–5, B1–7, B5–3, DR–5, AL–4.

Relay D operates and at its contacts D–5 (FIGURE 3) releases relay B2, contacts B1–9 having previously opened in preparation to release relay B2; and at its contacts D–1 (FIGURE 2) releases relay L. The count of seven on the deviation chain is thus reduced to six. Relay L releases relay D which reoperates relay L to provide the second pulse.

(2) *Second lower pulse.*—Lower relay L operates and at its contacts L–8 (FIGURE 3) operates relay B5 over the circuit extending from zero volt conductor over contacts L–8, D–6, C18, AL–8, DR–7, B1–11, B2–10, C–9, coil of B5, DV–3, to —48 volt; and at its contacts L4 energizes relay D.

Relay B5 operates and at its contacts B5–7 locks to the lower hold circuit over contacts AL–4, DR–5, B5–7, and B4–9; at its contacts B5–8 prepares a holding circuit to the raise hold circuit; and at its contacts B5–3 opens the holding circuits of relays B1 and C to the lower hold circuit in preparation for the release of these relays. The count of six on the chain is thus reduced to five.

Relay D at its contacts D–5 releases relays B1 and C; and releases relay L. Relay L releases relay D which closes the circuit of relay L to provide the third pulse.

(3) *Third lower pulse.*—Relay L operates relay B4 over the lower drive conductor, contacts AL–8, DR–7, B1–10, B5–11, coil of B4, DV–3, to —48 volt; and at its contacts L–4 operates relay D. Relay D operates and releases relay B5 by disconnecting zero volt from the raise hold conductor, contacts B4–9 having previously opened; and at contacts D–5 releases relay L. The count of five on the chain is now reduced to four.

Relay L releases relay D which closes the circuit of relay L to provide the fourth pulse.

(4) *Fourth–Sixth lower pulses.*—Relay L operates relay B3. Relay D releases relay B4. The deviation chain count is now three. Relay L operates relay B2. Relay D releases relay B3. The deviation chain count is now two. Relay L operates relay B1. Relay D releases relay B2. The deviation chain count is now one.

(5) *Seventh lower pulse.*—Relay L operates relay A over the lower drive conductor, contacts AL–8, DR–7, B1–11, B2–10, C–6, B1–3, rectifier, coil of A, to —48 volt; and at its contacts L–4 operates relay D. Relay A operates and locks over contacts A–4, AL–4, to the zero volt on the lower hold conductor.

Relay D operates, and at its contacts D–5 removes ground from the raise hold conductor releasing relay B1, contacts A–5 having opened prevously; and at contacts B–5 releases relay L. Relay L releases relay D.

Thus with the deviation switch set at position 10, a raise of seven steps followed by seven "lower" steps does not result in an automatic reporting of deviation.

(d) SYSTEM OPERATION IN RESPONSE TO RECEIPT OF LOWER PULSES LESS IN NUMBER THAN SET DEVIATION FOLLOWED BY RAISE PULSES LESS IN NUMBER THAN SET DEVIATION

Assuming now that the deviation counting chain is reset; that the deviation set switch DSS is set at 10; and that as a result of the slider of P1 being adjusted downwardly, seven lower pulses are received to drive the deviation chain forward until relay B2 is operated on the second round. Relay AL is operated, relay A released on the first pulse, relay C operated and locked on the sixth pulse, and as a result of the slider of P1 being adjusted upwardly, seven raise pulses are transmitted to the deviation chain. As now shown, in the present example, the raise pulses drive the chain in a reverse or downward direction.

(1) *First raise pulse.*—Raise relay R operates and at its contacts R–6 (FIGURE 3) operates relay B1 over the circuit extending from zero volt conductor over contacts R–6, D–3, C8, AL–9, DR–7, B1–10, B5–10, B4–10, B3–10, B2–11, coil of B1, DV–3, to —48 volt; and at contacts R4, energizes relay D.

Deviation chain relay B1 operates and locks to the raise hold circuit over contacts A–5, B1–7, B5–3, DR–5, and AL–5, and at its contacts B1–8 prepares a holding circuit for itself from the coil of B1 over contacts B2–6, B1–8, DR–6, AL–7 to the lower hold circuit.

Disconnect relay D operates and at its contacts D–4 releases relay B2 which has been holding over the circuit extending from the zero volt conductor (FIGURE 3) over contacts D–4, C10, AL–7, DR–6, B2–8, B3–6, coil of B2, to —48 volt, contacts B1–9 having prevously been opened. The count on the chain has now been reduced to six. In the drive circuit, disconnect relay D releases raise relay R, and raise relay R releases relay D which operates raise relay R to provide the second pulse.

(2) *Second raise pulse.*—Raise relay R provides the second pulse to the chain to operate relay B5, the circuit extending from zero volt placed on the raise drive conductor, over contacts AL–9, DR–7, B1–11, B2–10, C–9, coil of relay 5, DV–3, to −48 volt; and at its contacts R4 operates relay D.

Deviation chain relay B5 operates and locks to the raise hold circuit over contacts B4–9, B5–7, DR–5, and AL–5; and at its contacts B5–3 prepares a holding circuit to the lower hold circuit over contacts B5–8, B1–6, DR–6, and AL–7.

Relay D operates and at its contacts D–4 (FIGURE 3) releases relays B1 and C. Relay B1 has been holding over the path extending from zero volt conductor (FIGURE 3), over contacts D–4, C10, AL–7, DR–6, B1–8, B2–6, coil of B1, DV–3, to −48 volt, contacts B5–3 having opened previously. Relay C has been holding over the circuit extending from the zero volt conductor (FIGURE 3), over contacts D–4, C10, AL–7, DR–6, D30, C–7, the coil of C, DV–3, to −48 volt, contacts B5–3 having opened previously. The count on the chain is now reduced to five.

Disconnect relay D releases raise relay R which releases relay D which reoperates relay R to provide the third pulse.

(3) *Third–Sixth raise pulses.*—Raise relay R operates chain relay B4, and disconnect relay D releases relay B5. The count on the chain is now four. Raise relay R operates relay B3, and disconnect relay D releases relay B4. The count on the chain is now three. Raise relay R operates relay B2, and disconnect relay D releases relay B3. The count on the chain is now two. Raise relay R operates relay B1, and disconnect relay D releases relay B2. the count on the chain is now one.

(4) *Seventh lower pulse.*—As raise relay R operates to provide the second pulse, relay A is operated over the circuit extending from the zero volt conductor (FIGURE 3), over contacts R–6, D–3, C8, AL–9, DR–7, B1–11, B2–10, C–6, B1–3, rectifier, coil of A, DV–3, to −48 volt. Relay R at count R–4 operates relay D.

Disconnect relay D operates, and at its contacts D–4 releases relay B1 which has been holding from the zero volt conductor (FIGURE 3), over contacts D–4, D9, R15, C10, AL–7, D–6, B1–8, B2–6, coil of B1, DV–3, to −48 volt, contacts A–5 having previously opened. Relay D also opens the circuit of relay R.

When B1 releases, contacts B1–4 open to release relay AL, contacts A–2 and L–9 being previously opened. The release of raise relay R opens the circuit of disconnect relay D which releases. Thus operation of the deviation chain to register seven lower steps followed by seven raise steps does not result in a deviation report.

*II. Reporting responsive to rate of deviation*

In some installations, it is necessary to provide an arrangement in which automatic reporting is effected only responsive to the rate of deviation.

Referring to FIGURE 8, it will be apparent that W-wiring may be provided to connect clock contacts in the circuit deviation relay DV. As a result of such connection, each time that the clock contacts close, relay DV will operate over the path which extends from zero volt conductor over the W-wiring, the clock contacts, W-wiring, the coil of relay DV, to −48 volt. When the clock contacts open, relay DV releases.

Each time that relay DV operates, its contacts DV–1 (FIGURE 1) open the detector circuit so that stepping is arrested; contacts DV–2 (FIGURE 6) open a point in the circuit of relay DR; and contacts DV–3 (FIGURE 7) release any operated deviation chain relays B1–B5 (and relay C, if operated).

The clock contacts can be arranged to function at any desired time intervals. In conjunction with the setting of the deviation set switch of FIGURE 6, means are provided for effecting reports only responsive to the occurrence of a given rate of deviation.

For example, let us suppose that the clock contacts are arranged to function once every minute; that the deviation set switch (FIGURE 6) is set to position six as shown; and that the clock contacts have just closed and opened to operate and release deviation relay DV.

If now a set deviation of five steps (i.e., five steps more in one direction than the steps in the other direction) occurs during the minute interval before the clock contacts reoperate, deviation relay DR is operated by the chain and an automatic reporting occurs. If, however, a net deviation of only four steps occurs during such interval, as the clock contacts reclose, relay DV operates to release the reset the deviation counting chain, whereby a new count of deviation is initiated during the next measured time interval. Thus a deviation of at least five steps per minute must occur in order to provide an automatic report.

As another example, if the clock contacts are arranged to function once every hour and the deviation set switch is set to position 10, a deviation of at least ten steps per hours must occur to result in an automatic report by the equipment.

It should be appreciated that relay DV is connected to operate whenever a report is requested by the attendant at the control station, and relay DV in operation resets the deviation chain so that the deviation count starts over after each report.

*III. Range adjustment*

The bridge circuit BC (FIGURE 1) in the novel converter is readily adjusted to provide different ranges of operation. As shown in FIGURE 9, the potentiometer P2 is schematically represented as a 2000 ohm resistor with a slider, (although it actually is a 1999 ohm potentiometer of the form shown in FIGURE 1).

It is now apparent that potentiometer P1 is a 1000 ohm potentiometer, and that excursion of the slider on P1 from bottom to top represents a change in value from 200 pounds per square inch (p.s.i.) to 1000 p.s.i., i.e., a range of 800 p.s.i. The excursion of the slider of P1 from bottom to top should coincide with the excursion of the slider of P2 from 200 to 1000. Accordingly, the right side of the bridge may be considered to be in three parts; 0–200, 200–1000; and 1000–2000. By inserting resistor X between the −6 volt conductor and the lower end of potentiometer P1, and resistor Y between the upper end of potentiometer P1 and the −4 volt conductor, the left side of the bridge can be considered in three parts corresponding to the three parts of the right side.

A proportional equation between left and right hand parts can then be set up as follows:

$$\frac{X}{200}=\frac{1000}{800}=\frac{Y}{1000}$$

Cross multiplying in the first two members of the equation:

$$800X=200{,}000$$
$$X=250\text{ ohms}$$

Cross multiplying in the last two members of the equation:

$$800Y=1{,}000{,}000$$
$$Y=1250\text{ ohms}$$

Thus as the slider of potentiometer P1 goes through its excursion of 1000 ohms as the result of a change in the telemetered qauntity from 200 to 1000 p.s.i., the slider of potentiometer P2 goes through its excursion of 200 to 1000 ohms, which corresponds to a change of from 200 to 1000 p.s.i.

*IV. Additional examples of fast scan*

In that the fast scan adjustment provided by the converter is considered to be particularly unusual, additional examples of fast scan are now set forth hereat. Since the inintial example was set forth in detail, less detailed explanation is now provided for the other examples. It will be recalled that in the example given hereinbefore the thousands, hundreds, tens, and units chains assumed a position of 0090 upon closing the power switch, and operated in a "fast scan" to reach a setting of 1803. In the following brief examples, the figure on the left represents the analog signal which appears at the slider of potentiometer P1, and the sequence on the right represents the nature of the fast scan operation which results in the adjustment of the converter to such value. The operation of hundreds fast scan complete relay HF and tents fast scan complete relay TF is given at the right.

EXAMPLE 1

1803 ---------- {
0090
.
.
.
0990
1090
.
.
.
1890
1880HF
.
.
.
1800
1801TF
.
.
1803

EXAMPLE 2

1999 ---------- {
0090
.
.
.
0990
1090
.
.
.
1990HF
1991TF
.
.
.
1999

The second example represents a rather unusual condition. During the hundreds scan, raise pulses run the hundreds chain up to relay H9 and on the tenth raise pulse, hundreds raly H9 and thousands relay TH1 operate, and tens relay T9 and thousands relay TH0 releases. Raise pulses continue, resulting in the further stepping of the hundreds chain to relay H9.

At this point hundreds fast scan complete relay HF operates over a special circut to terminate hundreds scan, the circuit extending from the zero volt conductor (FIGURE 2) over contacts H0–5, H1–5, etc., up to H8–5, H9–4, TH1–13, TH0–12, L–6, HF–1, coil of HF to —48 volt. However 1990 is below 1999, and so as a result of the bridge unbalance, raise pulses continue.

The operation of hundreds fast scan complete relay HF results in the transfer of the raise circuit of the hundreds chain from fast scan at contacts HF–6 (FIGURE 4) to regular on-line scan at HF–5 (FIGURE 4) but this latter circuit is open at contacts U9–13 (FIGURE 3).

However, due to the raise pulses, the units chain is driven upwardly through contacts HF–4 (FIGURE 3). The first raise pulse received after relay HF operates results in the operation of tens fast scan complete relay TF, the circuit extending from the zero volt conductor (FIGURE 2), over contacts HF–2, R–5, D–2, TF–1, coil of TF, to —48 volt. When the units chain in its upward stepping reaches units relay U9, the bridge is in balance and no further raise or lower pulses ensue. Additionally, the circuit of relay R is opened as described before to guard against any further pulsing.

EXAMPLE 3

1000 ---------- {
0090
.
.
.
0990
1090
1080HF
.
.
1000TF

In this example, fast scan of the hundreds chain due to raise pulses occurs until the unmeral 1090 is reached and the bridge is unbalanced in the opposite direction. Then lower pulses are transmitted over contacts TF–5, D20, and C19 to the tens chain. On the first lower pulse, hundreds fast scan complete relay HF operates. When the tens chain run down to T0, the bridge is in balance and stepping ceases. Tens fast scan complete relay TF then operates over a special circuit which extends from the zero volt conductor (FIGURE 2) over contacts T0–4, rectifier, conductor C3, TF–1, coil of relay TF, to —48 volt. Relay TF at its contacts TF–4, TF–5, and TF–6 transfers the tens chain from fast scan to regular scan, and at contacts TF–7 (FIGURE 4) prepares a regular scan circuit to the hundreds chain.

EXAMPLE 4

0999 ---------- {
0090
.
.
.
0990
1090
1080HF
.
.
.
1000TF
0999

Raise pulses drive the hundreds chain in a fast scan to relay H0 at which time the reading 1090 exceeds 0990. Lower pulses then drive the tens chain backward in fast scan, relay HF operating on the first lower pulse; when the lower pulses drive the tens chain backward to T0, relay TF operates over the special circuit described. With relays HF and TF operated, fast scan is concluded, and the chains are set up for on-line follow. Accordingly the next lower pulse drives the units chain backward operating relay U9 over the circuit extending from the zero volt conductor (FIGURE 3) over contacts L–8, D–6, TF–4, U0–11, U1–10, D21, U9, to —48 volt. The same pulse (a) drives the tens chain backward operating relay T9, (b) drives the hundreds chain backward operating H9, (c) drives the thousands chain backward operating TH0.

EXAMPLE 5

0873 ---------- {
0090
.
.
.
0880HF
0890
0870
0871HF
0872
0873

Raise pulses drive the hundreds chain to 0890. The lower pulses then drive the tens chain backward to 0870, the first lower pulse thereafter operating relay HF. The raise pulses then drive the units chain in on-line fashion to 0873, the first raise pulse thereafter operating relay TF. Relay TH1 does not operate.

EXAMPLE 6

| | |
|---|---|
| | 0090 |
| | 0190 |
| | 0180 HF |
| | . |
| | . |
| 0095 | . |
| | 0100 TF |
| | 0099 |
| | . |
| | . |
| | . |
| | 0095 |

EXAMPLE 7

| | |
|---|---|
| | 0090 |
| | 0080 HF |
| 0085 | 0081 TF |
| | . |
| | . |
| | . |
| | 0085 |

The bridge in Example 7 is initially unbalanced and pulsing to a lower number is initiated. The first lower pulse operates relay HF, and unbalances the bridge in the opposite direction, calling for raise pulsing. With relay HF operated, the first raise pulse thereafter operates relay TF; and also through HF–4 drives the units chain to U1. With relay TF operated, on-line follow operation results, the units chain continuing to be driven upwardly until units relay U5 operates. At such time the bridge is in balance and pulsing is terminated.

V. *Working values for the detector circuit*

In one embodiment of the invention, the following values of the components of the detector circuit were found to be satisfactory:

| | |
|---|---|
| Transistors TR1 to TR4 | 2N1892. |
| Resistors R3 | 2700 ohms 1%. |
| Resistors R4 | 2700 ohms 1%. |
| Resistors R5 | 800 ohms. |
| Resistors R6 | 15000 ohms 1%. |
| Resistors R7 | 15000 ohms 1%. |
| Variable Resistors VR2 | 10000 ohms. |
| Potentiometer P3 | 50 ohms. |
| Coil L1 | 4000 ohms. |
| Coil L2 | 4000 ohms. |
| Diodes D32 and D33 | 1N2070. |
| Resistors R1 | 620 ohms 5%. |
| Variable Resistors VR1 | 5000 ohms. |

VI. *Current input*

The novel bridge circuit is also operative to convert information represented by a current input to digit signals, such arrangement being shown schematically in FIGURE 11. With reference thereto, resistor R2 of FIGURE 1 has been replaced by resistor R27 which is 3000 ohms, and potentiometer P4 which is 1000 ohms. Potentiometer P2 contains 1999 ohms, which is considered to be 2000 ohms in the following description. It should be observed that potentiometer P2 now has contacts TH0–1, TH0–2, and TH0–3 at the top end and contacts TH1–1, TH1–2, and TH1–3 at the bottom end, so that the relay potentiometer now counts up from −4 volt in the direction of −6 volt.

As an example, it is first assumed that the analog input signal comprises a current input of from 4 ma. to 20 ma. as the represented telemetered device goes from 0 to 2000 units, such change representing the full range of potentiometer P2. Accordingly the slider of P2 (which is base *b1* of transistor TR1) must be capable of going from −4 volt to −6 volt as the input varies from 4 ma. to 20 ma. Base *b2* of transistor TR2 which is the same as the slider of P1 must vary from −4 volt to −6 volt as the input varies from 4 ma. to 20 ma. In other words, the slider of P1 must vary over a 2 volt range while the input varies over a 16 ma. range.

To accomplish such variation, resistance is connected across the plus and minus current input leads which is of a value to produce a 2 volt potential between the plus (+) and minus (−) leads, with an excursion of 16 ma. Thus:

$$R=\frac{E}{I}=\frac{2}{.016}=125 \text{ ohms}$$

The resistance is divided into two parts comprising a 100 ohm resistor R28 and a 50 ohm variable resistor VR3 which allows a setting of 125 ohms to be attained at the midpoint of the potentiometer with provision for vernier adjustment up or down.

At 4 ma. therefore, the voltage between the + and − current input leads is $$E=IR=(.004)\ (125)=.5 \text{ volt}$$

and at 20 ma. the voltage between the + and − current input leads is:

$$E=IR=(.020)\ (125)=2.5 \text{ volt}$$

However, the slider of P1 should read −4 volt at 4 ma. The slider of P4 must therefore be moved upwardly from its lowermost position which is −4 volt, to its mid-position of −3.5 volts whereby the −3.5 volts plus −.5 volt gives −4 volts. At 20 ma. input, the −3.5 volts plus the −2.5 volts gives −6 volts.

As the current input varies between 4 ma. and 20 ma., the slider of P1 (i.e., base *b2*) varies between −4 volts and −6 volts and the slider of P2, i.e., base *b1*, also varies between −4 volts and −6 volts.

Any variation in the current to base *b1* as a result of a change of resistance in the circuit of the base *b1* will be reflected in a slight change in the potential of the slider of P4. This change in potential of the slider of P4 will result in a change of current through base *b2*, which will tend to correct for the change through base *b1*.

A further exemplary embodiment is shown in FIGURE 12. Assuming that the input of 4–20 ma. should represents a range of 500–1500, and the slider of potentiometer P2 represents 1000 millivolts or 1 volt. Accordingly an excursion from 4.20 ma. should also represent a 1 volt change on the slider of P1. The value of resistance between the + and − leads is determined as follows:

$$R=\frac{E}{I}=\frac{1}{.016}=62\tfrac{1}{2} \text{ ohms}$$

Dividing the resistance into two parts comprising a 50 ohm resistor and a 25 ohm variable resistor will permit a setting of 62½ ohms to be attained at the mid-point of the potentiometer.

Thus at 4 ma. the voltage between the + and − current input leads is $$E=IR=(.004)\ (62.5)=.25 \text{ volt}$$

and at 20 ma. the voltage between the + and − current input leads is $$E=IR=(.020)(62.5)=1.25 \text{ volts}$$

With the voltage divider comprising resistor R29 (3500 ohms) potentiometer P5 (1000 ohms) and resistor R30 (1500 ohms) between the zero volt and —6 volt conductors, the common connection between R29 and P5 will be at a potential of −3.5 volts and the common connection between P5 and R30 will be at −4.5 volts. The mid-point of the P5 will be at −4 volts potential.

If now the slider of P5 is moved downward to a potential of −4.25 volts, at 4 ma. the slider of P1 will be at (−4.25 volts) + (−.25 volt) or −4.5 volts. Accordingly, the slider of P2 will assume a potential of —4.5 volts with counting chain relays TH0, H5, T0, and U0 operated to give a reading of 0500.

At 20 ma. the slider of P1 will be at (—4.25 volts) + (—1.25 volts) or —5.50 volts. Accordingly, the slider of P2 will assume a potential of —5.50 volts with counting chain relays TH1, H5, T0, and U0 operated to give a reading of 1500.

Potentiometer P5 again allows or provides a means of adjusting the limit at lowest input ald also provides a vernier adjustment, whereas potentiometer VR3 allows a vernier adjustment of the span.

CONCLUSION

While the analog to digital converter described herein has been illustrated in its specific use in conjunction with telemetering equipment, the use of the converter with control equipment will be readily apparent to parties skilled in the art and is clearly within the scope of the invention. Furthermore, it should be understood that a single converter may be connected to have its input switched between different analog signal circuits to provide converted readings for a number of different units. Further the converter may have its output circuit connected for switching between different points of the controlled station.

Manifestly the uses of the novel analog to digital converter of the disclosure are too numerous to set forth. Therefore, while only certain particular embodiments of the invention have been shown and described, it is apparent that modifications and alterations may be made therein, and it is intended in the appended claims to cover all such modifications and alterations as may fall within the true spirit and scope of the invention.

What is claimed is:

1. In an analog to digital converter unit, an input circuit for providing an analog signal representative of a changing quantity, detector means operative to provide signals responsive to each predetermined increment of change in the value of the received analog signal, means including a counting chain means controlled by said signals from said detector means to provide a digital output which is representative of the received analog signal, a readout circuit for transmitting said digital output to associated equipment, deviation means including enabling means operable to enable said readout circuit to transmit the digital output only responsive to the occurrence of a plurality of increments of change of said counting chain means of a predetermined total net value in one direction from its previous readout position, and inhibitor means controlled by said enabling means to interrupt the operation of the detector means during the period of each readout.

2. In an analog to digital converter unit, an input circuit for providing an increasing and decreasing analog signal representative of a changing quantity, detector means operative to provide output signals with changes in the value of the received analog signal, means including counting chain means controlled by said output signals to step to correspondingly different positions to provide a digital output which is representative of the received analog signal, a readout circuit for transmitting said digital output to associated equipment, deviation means including enabling means for said readout circuit, and deviation measuring means for measuring the number of steps of said counting chain means after the previous readout including means for operating said enabling means only responsive to the measurement of a plurality of step changes of a predetermined net total value in one direction from the value of a signal at the previous readout, and reset means operative to reset said deviation measuring means to a predetermined start position for the purpose of starting a new measurement of the step changes of said counting change means subsequent to each readout.

3. In an analog to digital converter unit, an input circuit for providing an analog signal representative of a changing quantity, detector means operative to provide output signals with changes in the value of the received analog signal, first means operatively controlled by said output signals to provide a digital output which is representative of the received analog signal, a readout circuit for transmitting said digital output to associated equipment, and deviation means including counting chain means operable to measure the incremental changes which occur in said analog signal, enabling means controlled by said counting chain means to enable said readout circuit only responsive to measurement of a predetermined net number of incremental changes in one direction, reset means operative to reset said counting chain means to its start position subsequent to each readout operation, and means in said deviation means operative responsive to reset of said chain after each readout operation to control the chain to step forward from its start position in response to receipt of a signal of one class from said detector means which represents an increasing signal increment and to step forward in response to receipt of a signal of another class which represents a decreasing signal increment, said counting chain means being controlled after stepping from the starting position to step forward in response to the receipt of further signals from said detector means of the one of the classes which was first received, and to step backward in response to the receipt of signals of the other of said classes.

4. A converter as set forth in claim 3 in which said deviation means includes means for resetting said counting chain means at the start position responsive to movement of said counting chain means back to the start position in response to receipt of either class of signals from said detector means, the next received signal effecting forward stepping of said counting chain means.

5. In an analog to digital converter unit, an input circuit for providing an analog signal of changing value, detector means operative to provide output signals responsive to a predetermined change in the value of the received analog signal, means operative responsive to receipt of said output signals to provide a digital output which is representative of the received analog signal, a readout circuit for transmitting said digital output to associated equipment, and deviation means operable to enable said readout circuit only responsive to the occurrence of a net predetermined number of increments of change in a given direction, including a ring counting chain having "$n$" stages including a start stage, chain stepping means controlled by said detector means for coupling signals representative of increments of changes of the received signal in an increasing and decreasing direction to said ring chain to control same to step responsive to the receipt thereof, deviation reached control means connected for operation by said ring chain only responsive to the advancement to a predetermined stage beyond said start stage in either direction, and means for recycling the chain as a signal is received from said chain stepping means advancing the chain beyond a count of "$n$."

6. A converter as set forth in claim 5 in which said ring counting chain includes five counting stages, and means for recycling the chain as a signal is received from said chain stepping means advancing the ring counting chain beyond a count of five.

7. In an analog to digital converter unit, an input circuit for providing a variable value analog signal representative of a variable quantity, detector means operative to provide output signals responsive to change in the value of the received signal including a first circuit connected to said input circuit to receive said analog signal, a signal matching device for producing a signal which matches said received signal including a plurality of resistor members, a differential detector circuit including differential detector means connected to said input circuit and said signal matching device operative in response to the occurrence of a difference in the value of the signals provided by said input circuit and said signal matching device to provide a difference signal, a drive circuit controlled by said difference signal, counting chain means including a plurality of reversible relay decimal counting chains operatively controlled by said drive circuit to advance and decrease said counting chain means in sequence in a decimal count, said relays in said counting chain means being operable in said decimal count to connect different ones of said resistors in said signal matching device to match the variable analog signal with changes in an increasing and alternatively decreasing direction, and means controlled by said counting chain means to provide a digital output which is representative of the received analog signal.

8. A converter as set forth in claim 7 in which said signal matching means has "*n*" different signal producing steps and in which said reversible counting chain means includes a first, a second and a third counting chain and in which said first counting chain includes a plurality of relay means, each of which is connected to effect a $1/n$ change in said matching signal output responsive to operation thereof, said second counting chain includes a plurality of relay means each of which is connected to effect a $10/n$ change in said matching signal output responsive to operation thereof, and said third counting chain includes a plurality of relay means, each of which is connected to effect a $100/n$ change in said matching signal output responsive to operation thereof.

9. A converter as set forth in claim 7 in which said signal matching device comprises a first, a second and a third set of resistors, each set having a plurality of resistor steps, the resistance steps in the first, second and third set having different values, and in which said reversible relay counting chain means are comprised of a first, second and a third counting chain, each of which has "*p*" steps, means in said first chain operative to connect a different number of resistor steps of said first set in a leg of said signal matching device for each different step of said first chain, means in said second chain operative in each different step thereof to connect a different number of resistor steps of said second set in a leg of said signal matching device, and means in said third chain operative in each different step thereof to connect a different number of resistor steps of said third set in said leg of the signal matching device.

10. In an analog to digital converter unit, an input circuit for providing variable value analog signals representative of different quantities, detector means operative to provide an output signal responsive to changes in the value of the received signals, means including a plurality of counting devices, each of which devices is connected to represent a different order of count, and each of which is operable to different positions to represent digits of a different value in its order of count, start means for initially adjusting said plurality of digit-representative means to a start condition, and fast scan means including means operative to control said devices to operate from said predetermined count to the positions representative of the value of the number represented by the received signal, means operative to first control adjustment of said devices to a total value which is at least as high as that of the value of said number, means next operative responsive to the value of the tens digit of the devices being different than the value of the tens digit of the number which represents the analog signal input to effect operation of said devices to a position which represents a total value at least as low as the value of said number, and means responsive to a disagreement between the value of the units digit on the devices and the units digit of the number which represents the analog signal input operative to thereafter adjust the device for the lowest order to the position representative of the digit of the lowest order in the number, and means operative with changes in the value of the analog signal input thereafter to adjust said devices to the numerical value for such changing signal in the order progressing with the adjustment of the device for the lowest order digit in the direction of the device for the higher order digits.

11. In an analog to digital converter unit, an input circuit for providing variable value analog signals representative of different quantities, means for providing a digital number representative of each different quantity including detector means operative to provide a signal output responsive to changes in the value of the received signals, a plurality of decimal counting means, one of which is connected to provide the hundreds digit, one of which is connected to provide the tens digit and another of which is operative to provide the units digit, and each of which is operable to different positions to represent digits of a different value in its order of count, and fast scan means including means operative to next control adjustment of said hundreds counting means to the position in which the total value is at least as high as the total value of the number, means operative in the event of disagreement of the value of the tens digit on the tens counting means with the value of the number which represents the analog signal to next adjust the tens counting means to a digital value which is at least as low as the total value of the number, and means operative thereafter in the event of disagreement of the tens digit counting device with the value of the tens digit which represents the received analog signal to adjust the units counting means to the value of the units digit in the number which represents the analog signal input, and means operative with changes in the analog signal input to adjust the counting means to first adjust the units counting means and thereafter the tens and hundreds counting means in sequence to the value of the quantity represented by the changing analog signal.

12. In an analog to digital converter unit, an input circuit for providing increasing and decreasing analog signals representative of changing quantities, detector means including step means operative to different steps to provide different output signals responsive to changes in the value of the received analog signals, and means controlled by said output signals to provide a digital output which is representative of the received analog signals, a readout circuit for transmitting said digital output to associated equipment, and rate-of-deviation means including means for measuring a predetermined time period, and operable to enable said readout circuit only responsive to the occurrence of a plurality of step changes having a net total change of said predetermined value in a predetermined time period.

13. In an analog to digital converter unit, an input circuit for providing variable value analog signals representative of different quantities, detector means operative to provide a signal output responsive to changes in the value of the received signals, counting means including a plurality of counting devices, each of which devices is connected to provide a different order of count and each of which is operable to a number of different count positions to represent digits of different values in its order of count, means operative responsive to receipt of the first signal over said input means and said detector means to first control adjustment of the counting device which provides a higher order one of the digits in the digital signal output and thereafter the counting device which provides the successively lower order digits in the digital output signal, readout means for transmitting said digital output signal to associated equipment, means controlled by said counting devices for effecting operation of said readout means subsequent to complete adjustment of each of the counting devices to the digital value corresponding to the input signal, and means responsive to completion of said transmission by said readout means operative to control said counting means to change in count without reset in an increasing and alternatively decreasing direction only the exact number of increments represented by the change in the value of said input signal from the previous signal.

14. In an analog to digital converter unit, an input circuit for providing a variable value analog signal representative of variable quantity, detector means operative to detect changes in the value of the received signal, means including first counting chain means controlled by said detector means to change one step for each predetermined increment of change indicated by said detector means, and means in said first counting chain means operative to generate a digital signal output which is representative of the position of the counting chain means determined by the received analog signal, a readout circuit for transmitting the digital signal output of said first counting chain means to associated equipment, and deviation measuring means including further counting chain means for counting each deviational step of the first counting chain means from its position at the time of a previous readout, and enabling means controlled by said further counting chain means to enable said readout circuit only after operation of said further counting chain means over a predetermined number of steps from the previous readout.

15. A converter unit as set forth in claim 14 in which said enabling means includes deviation switch means operable to different predetermined positions to represent a different number of steps of said further counting chain means, and means operable to enable said readout means with operation of said further counting chain means to the step represented by the operated position of said switch means.

16. A converter unit as set forth in claim 14 in which said further counting chain means includes means operable to continuously indicate the algebraic sum of step changes in both an increasing and decreasing direction from the previous position of said further chain means, and said enabling means includes means for enabling said readout circuit only responsive to a count by said further counting chain means of a predetermined net plurality of step changes in either direction.

References Cited by the Examiner

UNITED STATES PATENTS

| | | | |
|---|---|---|---|
| 2,539,623 | 1/1951 | Heising | 340—347 |
| 2,896,198 | 7/1959 | Bennett | 340—347 |
| 2,940,071 | 6/1960 | Kindred | 340—347 |
| 3,023,371 | 2/1962 | Balish et al. | 340—347 X |
| 3,100,298 | 8/1963 | Fluhr | 340—347 |
| 3,124,794 | 3/1964 | Patmore | 340—347 |

MALCOLM A. MORRISON, *Primary Examiner.*